United States Patent
Lim et al.

(10) Patent No.: US 11,495,541 B2
(45) Date of Patent: Nov. 8, 2022

(54) THREE-DIMENSIONAL SEMICONDUCTOR MEMORY DEVICE

(71) Applicant: Samsung Electronics Co., Ltd., Suwon-si (KR)

(72) Inventors: Bongsoon Lim, Seoul (KR); Sang-Wan Nam, Hwaseong-si (KR); Sang-Won Park, Seoul (KR); Sang-Won Shim, Seoul (KR); Hongsoo Jeon, Suwon-si (KR); Yonghyuk Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 493 days.

(21) Appl. No.: 16/592,886

(22) Filed: Oct. 4, 2019

(65) Prior Publication Data

US 2020/0168547 A1 May 28, 2020

(30) Foreign Application Priority Data

Nov. 28, 2018 (KR) .................. 10-2018-0149912

(51) Int. Cl.
| | | |
|---|---|---|
| *H01L 23/535* | (2006.01) | |
| *H01L 27/11573* | (2017.01) | |
| *H01L 27/11582* | (2017.01) | |

(52) U.S. Cl.
CPC ...... *H01L 23/535* (2013.01); *H01L 27/11573* (2013.01); *H01L 27/11582* (2013.01)

(58) Field of Classification Search
CPC ............. H01L 23/535; H01L 27/0688; H01L 23/5226; H01L 27/11524; H01L 27/11565; H01L 27/11556
See application file for complete search history.

(56) References Cited

U.S. PATENT DOCUMENTS

| | | | | |
|---|---|---|---|---|
| 8,933,502 | B2* | 1/2015 | Higashitani | G11C 16/06 257/326 |
| 9,502,299 | B2 | 11/2016 | Hishida et al. | |
| 9,837,433 | B2 | 12/2017 | Dh et al. | |
| 10,032,791 | B2 | 7/2018 | Lee et al. | |
| 2011/0266604 | A1 | 11/2011 | Kim et al. | |
| 2015/0162345 | A1 | 6/2015 | Lee et al. | |
| 2016/0163732 | A1 | 6/2016 | Lim et al. | |
| 2017/0200736 | A1 | 7/2017 | Park et al. | |
| 2017/0207234 | A1* | 7/2017 | Park | H01L 27/11556 |
| 2017/0309634 | A1 | 10/2017 | Noguchi et al. | |
| 2017/0358593 | A1 | 12/2017 | Yu et al. | |
| 2018/0197967 | A1 | 7/2018 | Oh et al. | |
| 2020/0066742 | A1 | 2/2020 | Kim et al. | |

FOREIGN PATENT DOCUMENTS

KR    10-2020-0022252 A    3/2020

* cited by examiner

*Primary Examiner* — Changhyun Yi
(74) *Attorney, Agent, or Firm* — Muir Patent Law, PLLC

(57) ABSTRACT

A three-dimensional semiconductor memory device may include a first stack structure block including first stack structures arranged in a first direction on a substrate, a second stack structure block including second stack structures arranged in the first direction on the substrate, a separation structure disposed on the substrate between the first and second stack structure blocks and including first mold layers and second mold layers, and a contact plug penetrating the separation structure. A bottom surface of the contact plug may contact the substrate.

19 Claims, 21 Drawing Sheets

THREE-DIMENSIONAL SEMICONDUCTOR MEMORY DEVICE

CROSS-REFERENCE TO RELATED APPLICATION

This U.S. non-provisional patent application claims priority under 35 U.S.C. § 119 to Korean Patent Application No. 10-2018-0149912, filed on Nov. 28, 2018, in the Korean Intellectual Property Office, the disclosure of which is hereby incorporated by reference in its entirety.

BACKGROUND

Embodiments of the inventive concepts relate to a semiconductor memory device and, more particularly, to a three-dimensional (3D) semiconductor memory device.

Semiconductor memory devices have been highly integrated to provide excellent performance and low manufacture costs. The integration density of semiconductor memory devices directly affects the costs of the semiconductor memory devices, thereby resulting in a demand of highly integrated semiconductor memory devices. The integration density of two-dimensional (2D) or planar semiconductor memory devices may be mainly determined by an area where a unit memory cell occupies. Therefore, the integration density of the 2D or planar semiconductor memory devices may be greatly affected by a technique of forming fine patterns. However, since extremely high-priced apparatuses are needed to form fine patterns, the integration density of 2D semiconductor devices continues to increase but is still limited. Thus, three-dimensional (3D) semiconductor memory devices have been developed to overcome the above limitations. 3D semiconductor memory devices may include memory cells three-dimensionally arranged.

SUMMARY

Embodiments of the inventive concepts may provide a three-dimensional (3D) semiconductor memory device with improved electrical characteristics.

According to some examples, a 3D semiconductor memory device may include a first stack structure block including first stack structures arranged side by side in a first direction on a substrate, a second stack structure block including second stack structures arranged side by side in the first direction on the substrate, a separation structure disposed on the substrate between the first stack structure block and the second stack structure block and including first mold layers and second mold layers, and a contact plug penetrating the separation structure. A bottom surface of the contact plug may be in contact with the substrate.

According to some examples, a 3D semiconductor memory device may include a first stack structure block including first stack structures arranged side by side in a first direction on a first substrate, a second stack structure block including second stack structures arranged side by side in the first direction on the first substrate, a separation structure disposed on the first substrate between the first stack structure block and the second stack structure block and including first mold layers and second mold layers, a first contact plug penetrating the separation structure and the first substrate, a second contact plug penetrating the separation structure and connected to the first substrate, and a connection line connecting the first contact plug and the second contact plug.

According to some examples, a 3D semiconductor memory device may include a first stack structure block including first stack structures arranged side by side in a first direction on a substrate, the first stack structure block including a first end portion having a wall structure, a separation structure disposed on the substrate and disposed on a first sidewall of the first end portion of the first stack structure block, and first contact plugs penetrating the separation structure and arranged along the first sidewall of the first end portion.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
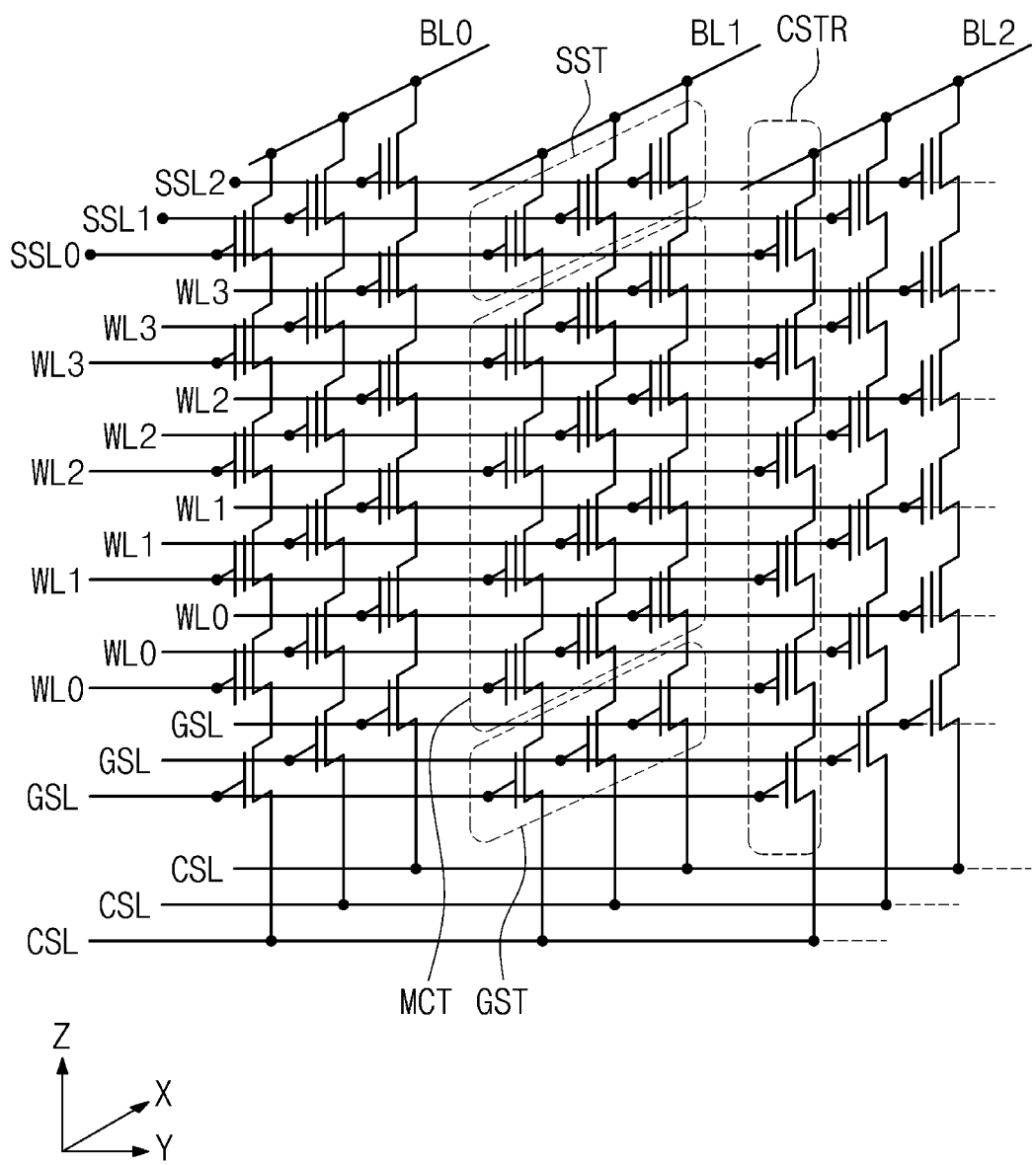
FIG. 1 is a schematic circuit diagram illustrating a cell array of a three-dimensional (3D) semiconductor memory device according to some embodiments of the inventive concepts.

FIG. 1 is a schematic circuit diagram illustrating a cell array of a three-dimensional (3D) semiconductor memory device according to some embodiments of the inventive concepts.

Referring to FIG. 1, a 3D semiconductor memory device may include common source lines CSL, a plurality of bit lines BL0 to BL2, and a plurality of cell strings CSTR provided between one of the common source lines CSL and the bit lines BL0 to BL2.

The bit lines BL0 to BL2 may be two-dimensionally arranged, and a plurality of the cell strings CSTR may be connected in parallel to each of the bit lines BL0 to BL2. Thus, the cell strings CSTR may be two-dimensionally arranged on the common source lines CSL or a substrate.

Each of the cell strings CSTR may include a ground selection transistor GST connected to a common source line CSL, a string selection transistor SST connected to one of the bit lines BL0 to BL2, and a plurality of memory cell transistors MCT provided between the ground and string selection transistors GST and SST. The ground selection transistor GST, the memory cell transistors MCT, and the string selection transistor SST may be connected in series to each other. A ground selection line GSL, a plurality of word lines WL0 to WL3 and one of string selection lines SSL0, SSL1 or SSL2, which are disposed between one of the common source lines CSL and the bit lines BL0 to BL2, may be used as gate electrodes of corresponding ground selection transistors GST, memory cell transistors MCT and string selection transistor SST, respectively.

Figure 2:
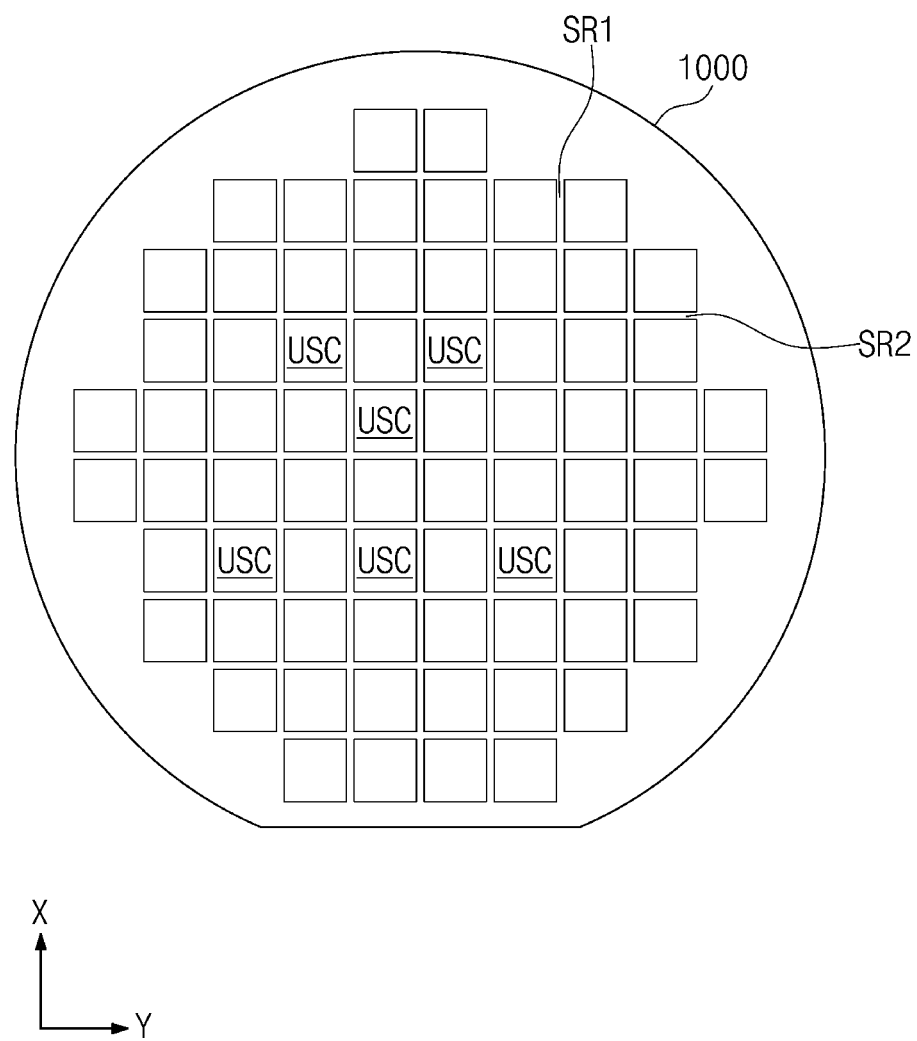
FIG. 2 is a plan view illustrating a semiconductor wafer including a 3D semiconductor memory device according to some embodiments of the inventive concepts.
Figure 3A:
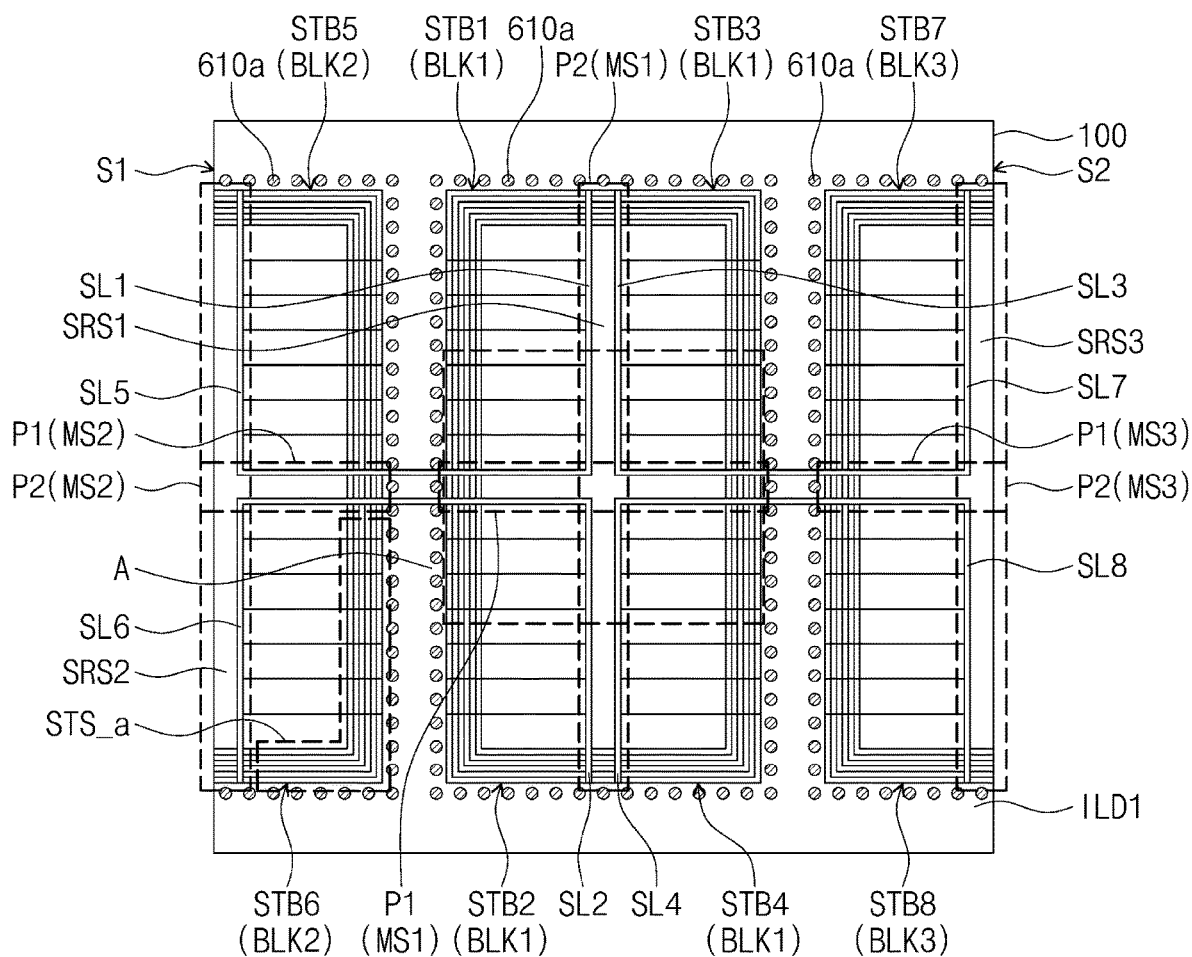
FIG. 3A is an enlarged view of a semiconductor chip of FIG. 2.
Figure 3B:
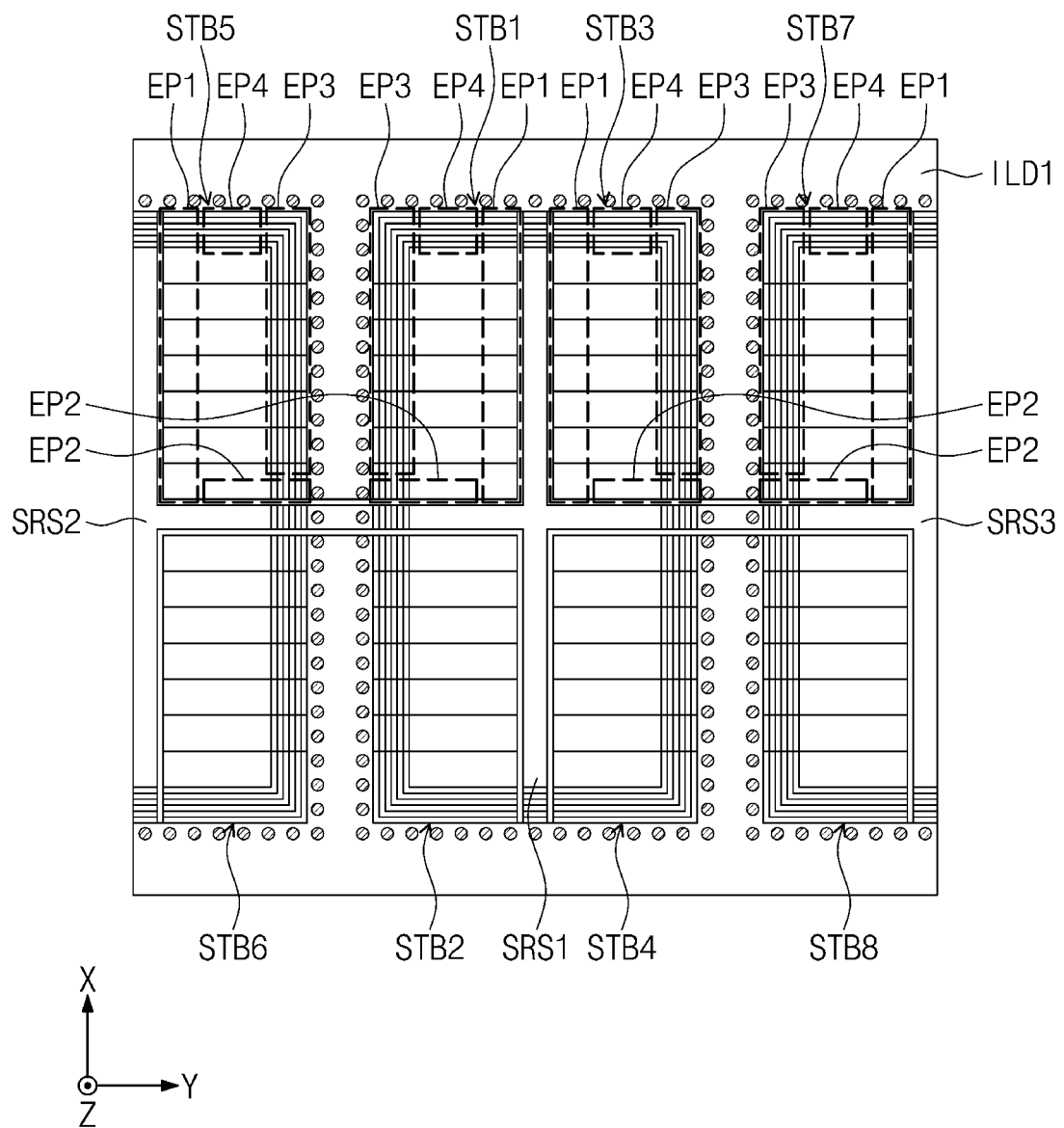
FIG. 3B is an enlarged view of a semiconductor chip of FIG. 2.
Figure 4:
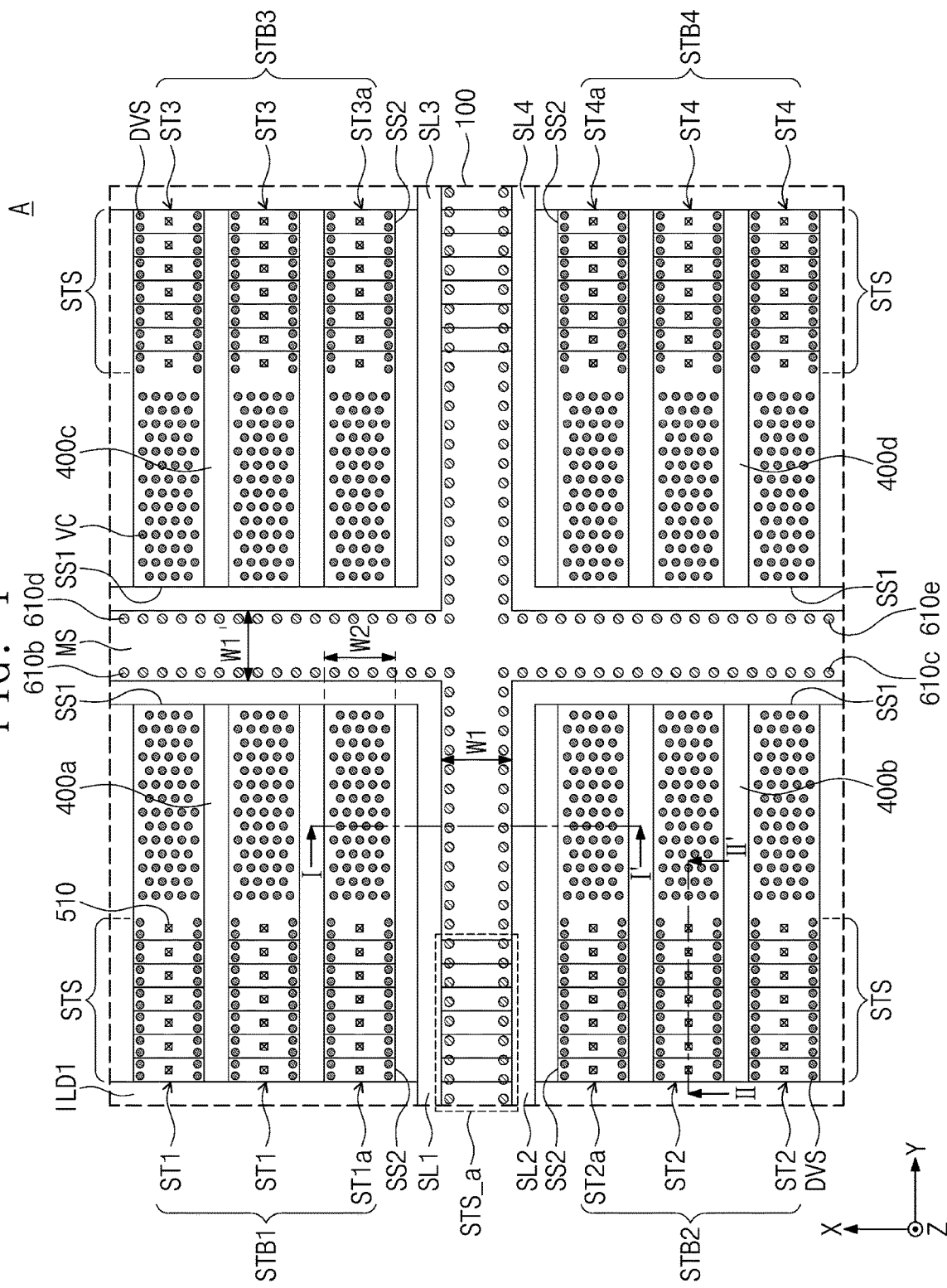
FIG. 4 is an enlarged view of a portion 'A' of FIG. 3A.
Figure 5:
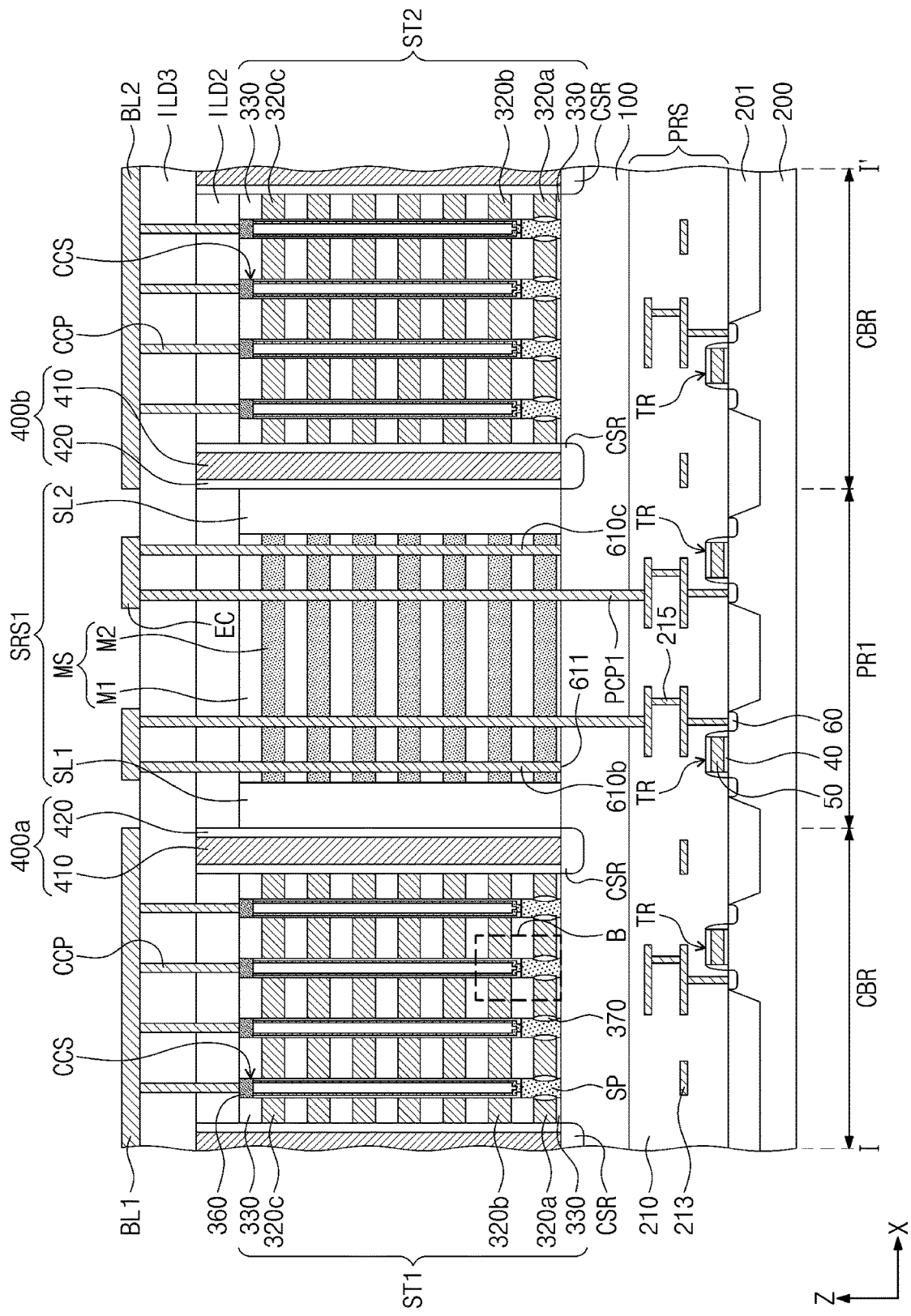
FIG. 5 is a cross-sectional view taken along a line I-I' of FIG. 4 to illustrate a 3D semiconductor memory device according to some embodiments of the inventive concepts.
Figure 6:
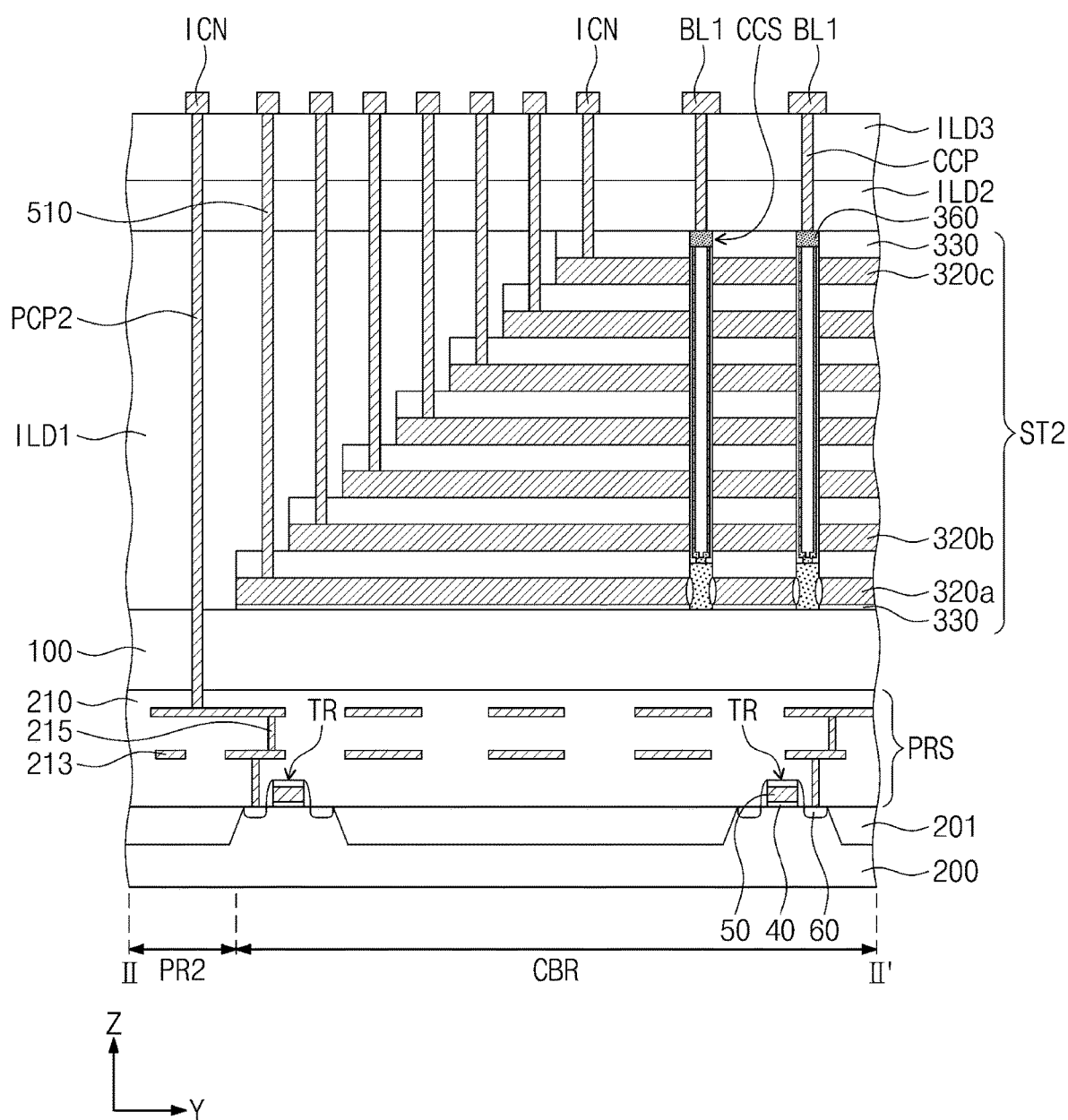
FIG. 6 is a cross-sectional view taken along a line II-II' of FIG. 4 to illustrate a 3D semiconductor memory device according to some embodiments of the inventive concepts.
Figure 7:
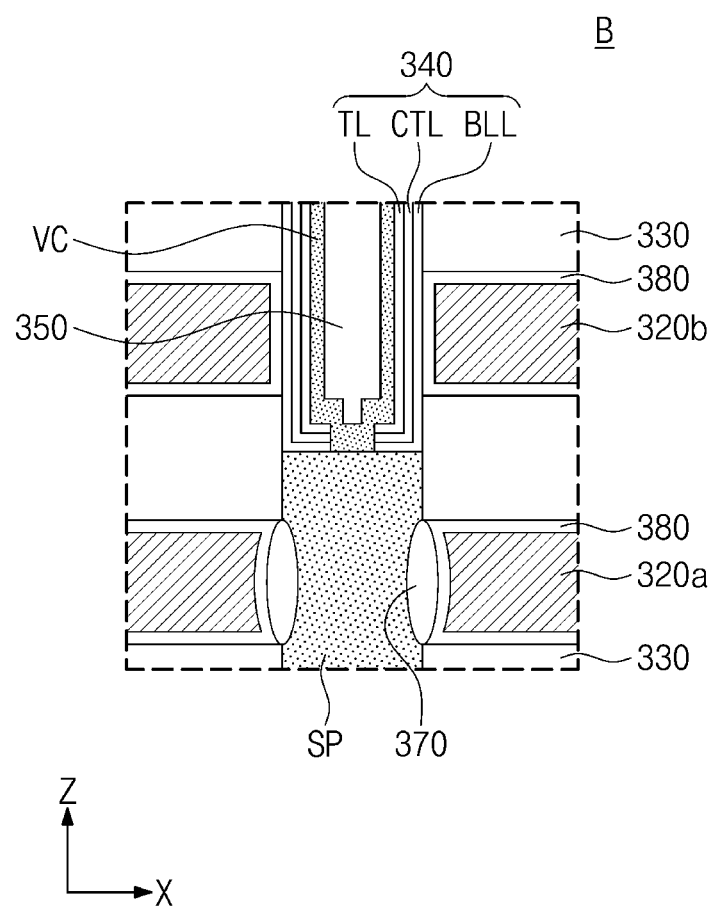
FIG. 7 is an enlarged view of a portion 'B' of FIG. 5.

FIG. 2 is a plan view illustrating a semiconductor wafer including a 3D semiconductor memory device according to some embodiments of the inventive concepts. FIG. 3A is an enlarged view of an undiced semiconductor chip of FIG. 2. FIG. 3B is an enlarged view of an undiced semiconductor chip of FIG. 2. FIG. 4 is an enlarged view of a portion 'A' of FIG. 3A. FIG. 5 is a cross-sectional view taken along a line I-I' of FIG. 4 to illustrate a 3D semiconductor memory device according to some embodiments of the inventive concepts. FIG. 6 is a cross-sectional view taken along a line II-II' of FIG. 4 to illustrate a 3D semiconductor memory device according to some embodiments of the inventive concepts. FIG. 7 is an enlarged view of a portion 'B' of FIG. 5. Some of the upper layers of the undiced semiconductor chip are not shown in the figures for description purposes. It will be understood that a semiconductor chip refers to a semiconductor device (e.g., semiconductor integrated circuit) separated from (e.g., cut from in singulation/dicing operation) a wafer (or a stack of wafers). For ease of description, this disclosure may refer to such chips prior to their separation from a wafer and may refer to such intermediate structure as an "undiced chip." It will be appreciated that the semiconductor chips described herein separated from a wafer will have the same structure as the undiced semiconductor chips. Thus, unless context indicates otherwise, the description herein is applicable to both undiced semiconductor chips that are part of a wafer and semiconductor chips separated from a wafer.

Referring to FIGS. 2 and 3A, a semiconductor wafer 1000 may include a plurality of undiced semiconductor chips USC (or unit chips). The plurality of undiced semiconductor chips USC may be spaced apart from each other in a first direction X and a second direction Y intersecting the first direction X. Scribe regions SR1 and SR2 may define the plurality of undiced semiconductor chips USC. The scribe regions SR1 and SR2 may include first scribe regions SR1 extending in the first direction X and second scribe regions SR2 extending in the second direction Y.

Each of the undiced semiconductor chips USC may include a substrate 100, blocks BLK1, BLK2 and BLK3, separation structures SRS1, SRS2 and SRS3, and a first interlayer insulating layer ILD1. The blocks BLK1, BLK2 and BLK3 may be disposed on the substrate 100. The blocks BLK1, BLK2 and BLK3 may be spaced apart from each other in the second direction Y on a top surface of the substrate 100. The blocks BLK1, BLK2 and BLK3 may include first, second and third blocks BLK1, BLK2 and BLK3. The second block BLK2 and the third block BLK3 may be spaced apart from each other in the second direction Y on the substrate 100, and the first block BLK1 may be disposed between the second block BLK2 and the third block BLK3. The first interlayer insulating layer ILD1 may be disposed on the substrate 100. The first interlayer insulating layer ILD1 may cover sidewalls of the blocks BLK1, BLK2 and BLK3 and the top surface of the substrate 100.

First to third separation structures SRS1, SRS2 and SRS3 may be disposed on the top surface of the substrate 100. The first separation structure SRS1 may penetrate the first block BLK1 on the top surface of the substrate 100. The first separation structure SRS1 may include a first mold structure MS1 and first to fourth separation layers SL1, SL2, SL3 and SL4. The first mold structure MS1 may include a first portion P1 and a second portion P2. The first portion P1 of the first mold structure MS1 may penetrate the first block BLK1 and may extend in the second direction Y. The second portion P2 of the first mold structure MS1 may penetrate the first block BLK1 and may extend in the first direction X. The first portion P1 and the second portion P2 of the first mold structure MS1 may intersect each other. The first block BLK1 may be divided into first to fourth stack structure blocks STB1, STB2, STB3 and STB4 by the first mold structure MS1. The first and second stack structure blocks STB1 and STB2 may be spaced apart from each other in the first direction X with the first portion P1 of the first mold structure MS1 interposed therebetween, and the third and fourth stack structure blocks STB3 and STB4 may be spaced apart from each other in the first direction X with the first portion P1 of the first mold structure MS1 interposed therebetween. The first and third stack structure blocks STB1 and STB3 may be spaced apart from each other in the second direction Y with the second portion P2 of the first mold structure MS1 interposed therebetween, and the second and fourth stack structure blocks STB2 and STB4 may be spaced apart from each other in the second direction Y with the second portion P2 of the first mold structure MS1 interposed therebetween. The first separation layer SL1 may be disposed between the first mold structure MS1 and the first stack structure block STB1, and the second separation layer SL2 may be disposed between the first mold structure MS1 and the second stack structure block STB2. The third separation layer SL3 may be disposed between the first mold structure MS1 and the third stack structure block STB3, and the fourth separation layer SL4 may be disposed between the first mold structure MS1 and the fourth stack structure block STB4.

The second separation structure SRS2 may penetrate the second block BLK2 on the top surface of the substrate 100. The second separation structure SRS2 may include a second mold structure MS2 and fifth and sixth separation layers SL5 and SL6. The second mold structure MS2 may include a first portion P1 and a second portion P2. The first portion P1 of the second mold structure MS2 may penetrate the second block BLK2 and may extend in the second direction Y. The second portion P2 of the second mold structure MS2 may extend along one sidewall of the second block BLK2 on the top surface of the substrate 100. One sidewall of the second portion P2 of the second mold structure MS2 may be aligned with a first sidewall S1 of the substrate 100. The second block BLK2 may be divided into fifth and sixth stack structure blocks STB5 and STB6 by the first portion P1 of the second mold structure MS2. The fifth and sixth stack structure blocks STB5 and STB6 may be spaced apart from each other in the first direction X with the first portion P1 of the second mold structure MS2 interposed therebetween. The fifth separation layer SL5 may be disposed between the fifth stack structure block STB5 and the second mold structure MS2, and the sixth separation layer SL6 may be disposed between the sixth stack structure block STB6 and the second mold structure MS2.

The third separation structure SRS3 may penetrate the third block BLK3 on the top surface of the substrate 100. The third separation structure SRS3 may include a third mold structure MS3 and seventh and eighth separation layers SL7 and SL8. The third mold structure MS3 may include a first portion P1 and a second portion P2. The first portion P1 of the third mold structure MS3 may penetrate the third block BLK3 and may extend in the second direction Y. The second portion P2 of the third mold structure MS3 may extend along one sidewall of the third block BLK3 on the top surface of the substrate 100. One sidewall of the second portion P2 of the third mold structure MS3 may be aligned with a second sidewall S2 of the substrate 100 which is opposite to the first sidewall S1 and is parallel to the first sidewall S1. The third block BLK3 may be divided into seventh and eighth stack structure blocks STB7 and STB8 by the first portion P1 of the third mold structure MS3. The seventh and eighth stack structure blocks STB7 and STB8 may be spaced apart from each other in the first direction X with the first portion P1 of the third mold structure MS3 interposed therebetween. The seventh separation layer SL7 may be disposed between the third mold structure MS3 and the seventh stack structure block STB7, and the eighth separation layer SL8 may be disposed between the third mold structure MS3 and the eighth stack structure block STB8.

End portions of the first to third mold structures MS1, MS2 and MS3, which are in contact with the first interlayer insulating layer ILD1, may have stair structures STS_a (see FIG. 4). Each of the first to eighth separation layers SL1 to SL8 may be formed as a single layer (e.g., a single homogenous layer). The first and fifth separation layers SL1 and SL5 may extend in parallel to the second direction Y to penetrate the first interlayer insulating layer ILD1 and may be connected to each other. The second and sixth separation layers SL2 and SL6 may extend in parallel to the second direction Y to penetrate the first interlayer insulating layer ILD1 and may be connected to each other. The third and seventh separation layers SL3 and SL7 may extend in parallel to the second direction Y to penetrate the first interlayer insulating layer ILD1 and may be connected to each other. The fourth and eighth separation layers SL4 and SL8 may extend in parallel to the second direction Y to penetrate the first interlayer insulating layer ILD1 and may be connected to each other. The first to third separation structures SRS1 to SRS3 may have the same stacked structure. The first separation structure SRS1 of the first to third separation structures SRS1 to SRS3 will be described later as a representative in more detail with reference to FIGS. 3 to 7.

Sidewalls of the first to fourth stack structure blocks STB1 to STB4, which are in contact with the first separation structure SRS1, may be substantially perpendicular to the top surface of the substrate 100 and may be flat surfaces substantially parallel to a third direction Z. Sidewalls of the fifth and sixth stack structure blocks STB5 and STB6, which are in contact with the second separation structure SRS2, may be substantially perpendicular to the top surface of the substrate 100 and may be flat. Sidewalls of the seventh and eighth stack structure blocks STB7 and STB8, which are in contact with the third separation structure SRS3, may be substantially perpendicular to the top surface of the substrate 100 and may be flat. It will be recognized that geometries described herein, such as "flat," "planar," "coplanar," etc. should not be interpreted as being perfectly geometrically flat, planar, coplanar, etc., but allow for typical deviations resulting from conventional semiconductor manufacturing processes. The term "substantially" or similar modifiers may be used to emphasize such understanding.

Referring to FIG. 3B, each of the first to eighth stack structure blocks STB1 to STB8 may include a first end portion EP1, a second end portion EP2, a third end portion EP3, and a fourth end portion EP4. The first end portion EP1 and the third end portion EP3 may be opposite to each other in the second direction Y when viewed in a plan view, and the second end portion EP2 and the fourth end portion EP4 may be opposite to each other in the first direction X when viewed in a plan view. The second end portion EP2 and the fourth end portion EP4 may be disposed between the first end portion EP1 and the third end portion EP3.

Sidewalls of the first end portions EP1 and the second end portions EP2 of the first to fourth stack structure blocks STB1 to STB4 may be in contact with the first separation structure SRS1. The first end portions EP1 and the second end portions EP2 of the first to fourth stack structure blocks STB1 to STB4 may have wall structures and be vertical without substantial deviation in the horizontal direction. For example, such first end portions EP1 may be flat and extend vertically from the substrate 100. The sidewalls of the first end portions EP1 of the first to fourth stack structure blocks STB1 to STB4 may be substantially perpendicular to the top surface of the substrate 100 and may be substantially parallel to the third direction Z. The sidewalls of the second end portions EP2 of the first to fourth stack structure blocks STB1 to STB4 may be substantially perpendicular to the top surface of the substrate 100 and may be substantially parallel to the third direction Z. Sidewalls of the third end portions EP3 and the fourth end portions EP4 of the first to fourth stack structure blocks STB1 to STB4 may be in contact with the first interlayer insulating layer ILD1. The third end portions EP3 and the fourth end portions EP4 of the first to fourth stack structure blocks STB1 to STB4 may have stair structures.

Sidewalls of the first end portions EP1 and the second end portions EP2 of the fifth and sixth stack structure blocks STB5 and STB6 may be in contact with the second separation structure SRS2. The first end portions EP1 and the second end portions EP2 of the fifth and sixth stack structure blocks STB5 and STB6 may have wall structures and be vertical without substantial deviation in the horizontal direction. For example, such first end portions EP1 and second end portions EP2 may be flat and extend vertically from the substrate 100. The sidewalls of the first end portions EP1 of the fifth and sixth stack structure blocks STB5 and STB6 may be substantially perpendicular to the top surface of the substrate 100 and may be substantially parallel to the third direction Z. The sidewalls of the second end portions EP2 of the fifth and sixth stack structure blocks STB5 and STB6 may be substantially perpendicular to the top surface of the substrate 100 and may be substantially parallel to the third direction Z. Sidewalls of the third end portions EP3 and the fourth end portions EP4 of the fifth and sixth stack structure blocks STB5 and STB6 may be in contact with the first interlayer insulating layer ILD1. The third end portions EP3 and the fourth end portions EP4 of the fifth and sixth stack structure blocks STB5 and STB6 may have stair structures.

Sidewalls of the first end portions EP1 and the second end portions EP2 of the seventh and eighth stack structure blocks STB7 and STB8 may be in contact with the third separation structure SRS3. The first end portions EP1 and the second end portions EP2 of the seventh and eighth stack structure blocks STB7 and STB8 may have wall structures and be vertical without substantial deviation in the horizontal direction. For example, such first end portions EP1 and second end portions EP2 may be flat and extend vertically from the substrate 100. The sidewalls of the first end portions EP1 of the seventh and eighth stack structure blocks STB7 and STB8 may be substantially perpendicular to the top surface of the substrate 100 and may be substantially parallel to the third direction Z. The sidewalls of the second end portions EP2 of the seventh and eighth stack structure blocks STB7 and STB8 may be substantially perpendicular to the top surface of the substrate 100 and may be substantially parallel to the third direction Z. Sidewalls of the third end portions EP3 and the fourth end portions EP4 of the seventh and eighth stack structure blocks STB7 and STB8 may be in contact with the first interlayer insulating layer ILD1. The third end portions EP3 and the fourth end portions EP4 of the seventh and eighth stack structure blocks STB7 and STB8 may have stair structures.

First contact plugs 610a may be arranged along a circumference of each of the first, second and third blocks BLK1, BLK2 and BLK3 when viewed in a plan view. The first contact plugs 610a may penetrate the first interlayer insulating layer ILD1. Bottom surfaces of the first contact plugs 610a may be in contact with the substrate 100. The first contact plugs 610a may be electrically connected to transistors of a peripheral circuit structure PRS. The first contact plugs 610a will be described later along with second to fifth contact plugs 610b, 610c, 610d and 610e in more detail with reference to FIGS. 4 and 5.

Each of the first to eighth stack structure blocks STB1 to STB8 may include stack structures ST (see FIG. 4) arranged in the first direction X and extending in the second direction Y, and contact structures 400 (see FIG. 4) disposed between the stack structures ST adjacent to each other and between the stack structure ST and the separation structure SRS1, SRS2 or SRS3 adjacent to each other. The first to fourth stack structure blocks STB1 to STB4 will be described as representatives of the first to eighth stack structure blocks STB1 to STB8 in more detail with reference to FIGS. 4 to 7.

Referring to FIGS. 4 to 6, a 3D semiconductor memory device may include a lower substrate 200, a peripheral circuit structure PRS, a substrate 100, and first to fourth stack structures ST1a to ST4a and ST1 to ST4. The lower substrate 200 may be or include a crystalline semiconductor substrate, such as a crystalline silicon substrate, a crystalline silicon-germanium substrate, a crystalline germanium substrate, or a single-crystalline epitaxial layer grown on a single-crystalline silicon substrate. A device isolation layer 201 may be disposed in the lower substrate 200. The device isolation layer 201 may define active regions of the lower substrate 200. The device isolation layer 201 may be an insulating material (e.g., silicon oxide).

The peripheral circuit structure PRS may be disposed on and/or in the lower substrate 200. The peripheral circuit structure PRS may include transistors TR, a peripheral circuit interlayer insulating layer 210, interconnection conductors 213, and vias 215. The transistors TR may be formed on and/or in the active regions of the lower substrate 200. Each of the transistors TR may include a peripheral gate insulating layer 40, a peripheral gate electrode 50, and source/drain regions 60. The peripheral circuit interlayer insulating layer 210 may be disposed on the lower substrate 200. The peripheral circuit interlayer insulating layer 210 may comprise several different interlayer insulating layers. The peripheral circuit interlayer insulating layer 210 may cover the transistors TR. The interconnection conductors 213 and the vias 215 may be disposed in the peripheral circuit interlayer insulating layer 210. The interconnection conductors 213 may be conductive pads and/or wiring. The interconnection conductors 213 located at different levels may be connected to each other through the vias 215 disposed therebetween. In addition, the transistors TR may be connected to the interconnection conductors 213 through the vias 215 and provide conductive wiring connections to other transistors TR, to terminals of the semiconductor chip (e.g., to chip pads) and/or to circuitry formed on and/or in substrate 100. It will be appreciated that the cross sectional view of FIGS. 5 and 6 provides a simplified representation of such wiring connections (and does not show wiring connections formed from interconnection conductors 213 extending in a direction perpendicular to the paper of FIGS. 5 and 6).

The substrate 100 may be disposed on the peripheral circuit structure PRS. The substrate 100 may include cell block regions CBR and peripheral circuit regions PR1 and PR2. The cell block regions CBR may be spaced apart from each other in the first direction X and the second direction Y, and the peripheral circuit regions PR1 and PR2 may define the cell block regions CBR. The peripheral circuit regions PR1 and PR2 may include a first peripheral circuit region PR1 and a second peripheral circuit region PR2. The first peripheral circuit region PR1 may correspond to a region on which the first separation structure SRS1 is disposed. The second peripheral circuit region PR2 may correspond to a region on which the first interlayer insulating layer ILD1 is disposed. The substrate 100 may be or include a crystalline semiconductor material. For example, the substrate 100 may be crystalline silicon (Si), crystalline germanium (Ge), crystalline silicon-germanium (SiGe), crystalline gallium-arsenic (GaAs), crystalline indium-gallium-arsenic (InGaAs), crystalline aluminum-gallium-arsenic (AlGaAs) or a combination thereof. The semiconductor material of the substrate 100 and lower substrate 200 may be the same or different from each other.

Each of the first to fourth stack structure blocks STB1 to STB4 may be disposed on each of the cell block regions CBR of the substrate 100. The first stack structure block STB1 may include the first stack structures ST1a and ST1 which are arranged in the first direction X and extend in the second direction Y on the top surface of the substrate 100. The second stack structure block STB2 may include the second stack structures ST2a and ST2 which are arranged in the first direction X and extend in the second direction Y on the top surface of the substrate 100. The third stack structure block STB3 may include the third stack structures ST3a and ST3 which are arranged in the first direction X and extend in the second direction Y on the top surface of the substrate 100. The fourth stack structure block STB4 may include the fourth stack structures ST4a and ST4 which are arranged in the first direction X and extend in the second direction Y on the top surface of the substrate 100.

Each of the first to fourth stack structures ST1a to ST4a and ST1 to ST4 may include insulating patterns 330 and gate electrodes 320a, 320b and 320c, which are alternately and repeatedly stacked on the substrate 100. The insulating patterns 330 may be stacked in the third direction Z. The insulating patterns 330 may be or include, for example, silicon oxide. Each of the gate electrodes 320a, 320b and 320c may be disposed between the insulating patterns 330 adjacent to each other in the third direction Z. The gate electrodes 320a, 320b and 320c may include a ground selection gate electrode 320a, cell gate electrodes 320b, and a string selection gate electrode 320c. The ground selection gate electrode 320a may correspond to a lowermost one of the gate electrodes 320a, 320b and 320c, and the string selection gate electrode 320c may correspond to an uppermost one of the gate electrodes 320a, 320b and 320c. The cell gate electrodes 320b may be disposed between the ground selection gate electrode 320a and the string selection gate electrode 320c. Plural string selection gate electrodes 320c may also be implemented in with the embodiments described herein and may be series connected (as part of the cell string CSTR) and formed above the cell gate electrodes 320b and the ground selection gate electrode 320a.

An end portion of each of the first to fourth stack structures ST1a to ST4a and ST1 to ST4, which is in contact with the first interlayer insulating layer ILD1, may have a stair structure STS. For example, a height of each of the first to fourth stack structures ST1a to ST4a and ST1 to ST4 may decrease as a distance from the first separation structure SRS1 in the second direction Y increases. In other words, lengths of the gate electrodes 320a, 320b and 320c in the second direction Y may sequentially decrease as a vertical distance from the substrate 100 increases. In some embodiments, each of the gate electrodes 320a, 320b and 320c may have an end portion in the stair structure STS of each of the first to fourth stack structures ST1a to ST4a and ST1 to ST4. The end portion of each of the ground selection and cell gate electrodes 320a and 320b may correspond to a portion of each of the ground selection and cell gate electrodes 320a and 320b, which is exposed by a gate electrode located directly thereon. In some embodiments, another end portion of each of the first to fourth stack structures ST1a to ST4a and ST1 to ST4, which is in contact with the first separation structure SRS1, may have a wall structure and be vertical without substantial deviation in the horizontal direction. For example, the another end portions may be flat and extend vertically from the substrate 100. Stack structures included in the fifth to eighth stack structure blocks STB5 to STB8 illustrated in FIGS. 3A and 3B may have the same structure as the first to fourth stack structures ST1a to ST4a and ST1 to ST4.

The first interlayer insulating layer ILD1 may be disposed on the second peripheral circuit region PR2 of the substrate 100 and may cover the stair structures STS of the first to fourth stack structures ST1a to ST4a and ST1 to ST4. A top surface of the first interlayer insulating layer ILD1 may be located at substantially the same level as top surfaces of the first to fourth stack structures ST1a to ST4a and ST1 to ST4. For example, the first interlayer insulating layer ILD1 may be a silicon oxide layer.

Referring to FIGS. 4 to 7, vertical cell channel structures CCS may penetrate the first to fourth stack structures ST1a to ST4a and ST1 to ST4 on the top surface of the substrate 100. The vertical cell channel structures CCS may be spaced apart from the stair structures STS of the first to fourth stack structures ST1a to ST4a and ST1 to ST4. The vertical cell channel structures CCS may include vertical channel portions VC, semiconductor pillars SP, charge storage structures 340, gap-fill layers 350, and pads 360. The vertical channel portions VC may penetrate the first to fourth stack structures ST1a to ST4a and ST1 to ST4. The vertical channel portions VC may be arranged in a zigzag formation or linearly arranged in the second direction Y when viewed in a plan view. Each of the vertical channel portions VC may have a hollow pipe shape, a hollow cylindrical shape, or a cup shape. In some examples, the vertical channel portions VC may be solid (e.g., a solid pillar) and gap-fill layers 350 may be omitted. Each of the vertical channel portions VC may be formed as a single layer (e.g., single homogenous layer) or a plurality of layers. For example, the vertical channel portions VC may be or include a single-crystalline silicon layer, an organic semiconductor layer, a carbon nano-structure or a combination thereof.

The semiconductor pillars SP may be disposed between the substrate 100 and the vertical channel portions VC, respectively. The semiconductor pillars SP may be disposed on the top surface of the substrate 100 and may penetrate through the ground selection gate electrode 320a. Each of the semiconductor pillars SP may contact a corresponding vertical channel portions VC. The semiconductor pillars SP may be or include a semiconductor material having the same conductivity type as the substrate 100 or may be or include an intrinsic semiconductor material. The charge storage structures 340 may be disposed between the vertical channel portions VC and the gate electrodes 320b and 320c. The charge storage structures 340 may extend in the third direction Z along outer sidewalls of the vertical channel portions VC. For example, the charge storage structures 340 may surround the outer sidewalls of the vertical channel portions VC, respectively. For example, each of the charge storage structures 340 may be formed as a single layer (e.g., single homogenous layer) or multi-layer including at least one of a silicon oxide layer, a silicon nitride layer, a silicon oxynitride layer, or a high-k dielectric layer.

As illustrated in FIG. 7, each of the charge storage structures 340 may include a tunnel insulating layer TL, a blocking insulating layer BLL, and a charge storage layer CTL. The tunnel insulating layer TL may be adjacent to each of the vertical channel portions VC and may surround the outer sidewall of the vertical channel portion VC. The blocking insulating layer BLL may be adjacent to the gate electrodes 320b and 320c. The charge storage layer CTL may be disposed between the tunnel insulating layer TL and the blocking insulating layer BLL. For example, the tunnel insulating layer TL may be a silicon oxide layer and/or a high-k dielectric layer (e.g., aluminum oxide ($Al_2O_3$) or hafnium oxide ($HfO_2$)). For example, the blocking insulating layer BLL may be a silicon oxide layer and/or a high-k dielectric layer (e.g., aluminum oxide ($Al_2O_3$) or hafnium oxide ($HfO_2$)). For example, the charge storage layer CTL may be a silicon nitride layer.

The gap-fill layers 350 may be disposed in inner spaces surrounded by the vertical channel portions VC, respectively. For example, each of the gap-fill layers 350 may include at least one of a silicon oxide layer, a silicon nitride layer, or a silicon oxynitride layer. The pads 360 may be disposed on the vertical channel portions VC, the charge storage structures 340, and the gap-fill layers 350. The pads 360 may include a conductive material, or a semiconductor material doped with dopants of which a conductivity type is different from that of the vertical channel portions VC.

A gate insulating layer 370 may be disposed between each of the semiconductor pillars SP and the ground selection gate electrode 320a. Sidewalls of the gate insulating layer 370 may have curved surfaces which are convex in opposite directions to each other. For example, the gate insulating layer 370 may be a thermal oxide layer.

Dummy channel structures DVS may penetrate the stair structures STS of the first to fourth stack structures ST1a to ST4a and ST1 to ST4 on the top surface of the substrate 100. The dummy channel structures DVS may penetrate the end portions of the gate electrodes 320a, 320b and 320c. The dummy channel structures DVS may have the same structure as the vertical cell channel structures CCS. The dummy channel structures DVS will be described later in more detail with reference to FIGS. 13 and 14.

A horizontal insulating layer 380 may be disposed between the charge storage structure 340 and the gate electrodes 320b and 320c, between the gate insulating layer 370 and the gate electrode 320a and may extend onto top surfaces and bottom surfaces of the gate electrodes 320a, 320b and 320c. For example, the horizontal insulating layer 380 may be a silicon oxide ($SiO_2$) layer and/or a high-k dielectric layer (e.g., aluminum oxide ($Al_2O_3$) or hafnium oxide ($HfO_2$)).

The first separation structure SRS1 may be disposed on the top surface of the substrate 100 between the first stack structure ST1a and the second stack structure ST2a which are closest to each other in the first direction X. In addition, the first separation structure SRS1 may extend in the first direction X between the first stack structures ST1 and ST1a and the third stack structures ST3 and ST3a facing the first stack structures ST1 and ST1a in the second direction Y. The first separation structure SRS1 may also extend in the first direction X between the second stack structures ST2 and ST2a and the fourth stack structures ST4 and ST4a facing the second stack structures ST2 and ST2a in the second direction Y. Furthermore, the first separation structure SRS1 may extend in the second direction Y between the third stack structure ST3a and the fourth stack structure ST4a which are closest to each other in the first direction X. First sidewalls SS1 of the first to fourth stack structures ST1a to ST4a and ST1 to ST4, which are parallel to the first direction X, may be in contact with the first separation structure SRS1. A top surface of the first separation structure SRS1 may be located at substantially the same level as the top surfaces of the first to fourth stack structures ST1a to ST4a and ST1 to ST4 and the top surface of the first interlayer insulating layer ILD1.

The first separation structure SRS1 may include a mold structure MS (i.e., the first mold structure MS1 of FIGS. 3A and 3B) and the first to fourth separation layers SL1, SL2, SL3 and SL4. The mold structure MS may include first mold layers M1 stacked in the third direction Z and second mold layers M2 respectively disposed between pairs of the first mold layers M1. Each of the second mold layers M2 may be disposed between pairs of the first mold layers M1 neighboring each other in the third direction Z. The second mold layers M2 may be disposed at the same levels as the gate electrodes 320a, 320b and 320c, respectively, and the first mold layers M1 may be disposed at the same levels as the insulating patterns 330, respectively. The first mold layers M1 may include a material having an etch selectivity with respect to the second mold layers M2. For example, each of the first mold layers M1 may be a silicon oxide layer, and each of the second mold layers M2 may be a silicon nitride layer.

The first separation layer SL1 may extend in the second direction Y between the mold structure MS and the first stack structure ST1a closest to the first separation structure SRS1 and may extend in the first direction X between the mold structure MS and the first sidewalls SS1 of the first stack structures ST1a and ST1. The first separation layer SL1 may be in contact with the first sidewalls SS1 of the first stack structures ST1a and ST1. The first sidewalls SS1 of the first stack structures ST1a and ST1 may be flat surfaces substantially perpendicular to the top surface of the substrate 100. The second separation layer SL2 may extend in the second direction Y between the mold structure MS and the second stack structure ST2a closest to the first separation structure SRS1 and may extend in the first direction X between the mold structure MS and the first sidewalls SS1 of the second stack structures ST2a and ST2. The second separation layer SL2 may be in contact with the first sidewalls SS1 of the second stack structures ST2a and ST2. The first sidewalls SS1 of the second stack structures ST2a and ST2 may be flat surfaces substantially perpendicular to the top surface of the substrate 100.

The third separation layer SL3 may extend in the second direction Y between the mold structure MS and the third stack structure ST3a closest to the first separation structure SRS1 and may extend in the first direction X between the mold structure MS and the first sidewalls SS1 of the third stack structures ST3a and ST3. The third separation layer SL3 may be in contact with the first sidewalls SS1 of the third stack structures ST3a and ST3. The first sidewalls SS1 of the third stack structures ST3a and ST3 may be flat surfaces substantially perpendicular to the top surface of the substrate 100. The fourth separation layer SL4 may extend in the second direction Y between the mold structure MS and the fourth stack structure ST4a closest to the first separation structure SRS1 and may extend in the first direction X between the mold structure MS and the first sidewalls SS1 of the fourth stack structures ST4a and ST4. The fourth separation layer SL4 may be in contact with the first sidewalls SS1 of the fourth stack structures ST4a and ST4. The first sidewalls SS1 of the fourth stack structures ST4a and ST4 may be flat surfaces substantially perpendicular to the top surface of the substrate 100. Each of the first to fourth separation layers SL1 to SL4 may be formed as a single layer (e.g., single homogenous layer). Each of the first to fourth separation layers SL1 to SL4 may be, for example, a silicon oxide layer.

In some embodiments, a width W1 of the mold structure MS in the first direction X and a width W1' of the mold structure MS in the second direction Y may be substantially equal to each other and may be substantially equal to a width W2, in the first direction X, of each of the first to fourth stack structures ST1a to ST4a and ST1 to ST4 (W1, W1'=W2). In certain embodiments, the width W1 of the mold structure MS in the first direction X and the width W1' of the mold structure MS in the second direction Y may be different from the width W2, in the first direction X, of each of the first to fourth stack structures ST1a to ST4a and ST1 to ST4 (W1, W1' W2).

A second interlayer insulating layer ILD2 may cover the top surfaces of the first to fourth stack structures ST1a to ST4a and ST1 to ST4, the top surface of the first interlayer insulating layer ILD1, and the top surface of the first separation structure SRS1. For example, the second interlayer insulating layer ILD2 may be/include a silicon oxide layer.

First to fourth contact structures 400a, 400b, 400c and 400d may extend in the third direction Z on the top surface of the substrate 100 to penetrate the second interlayer insulating layer ILD2. The first contact structures 400a may extend in the second direction Y between the first stack structures ST1 and ST1a adjacent to each other and between the first stack structure ST1a and the first separation structure SRS1 adjacent to each other. The second contact structures 400b may extend in the second direction Y between the second stack structures ST2 and ST2a adjacent to each other and between the second stack structure ST2a and the first separation structure SRS1 adjacent to each other. The third contact structures 400c may extend in the second direction Y between the third stack structures ST3 and ST3a adjacent to each other and between the third stack structure ST3a and the first separation structure SRS1 adjacent to each other. The fourth contact structures 400d may extend in the second direction Y between the fourth stack structures ST4 and ST4a adjacent to each other and between the fourth stack structure ST4a and the first separation structure SRS1 adjacent to each other. The first to fourth contact structures 400a, 400b, 400c and 400d may be in contact with the first separation structure SRS1.

In some embodiments, second sidewalls SS2 of the first stack structure ST1a, the second stack structure ST2a, the third stack structure ST3a and the fourth stack structure ST4a which are closest to the first separation structure SRS1 may be flat surfaces substantially perpendicular to the top surface of the substrate 100. The second sidewalls SS2 of the first to fourth stack structures ST1a to ST4a may be parallel to the second direction Y. In some embodiments, the first to fourth contact structures 400a to 400d which are disposed between the first separation structure SRS1 and the first to fourth stack structures ST1a to ST4a, respectively, may be in contact with the first to fourth separation layers SL1 to SL4 of the first separation structure SRS1 and may be spaced apart from the mold structure MS of the first separation structure SRS1.

Each of the first to fourth contact structures 400a to 400d may include a spacer 420 and a common source contact 410. For example, the common source contact 410 may be and/or include at least one of a metal material (e.g., tungsten, copper, or aluminum) or a transition metal material (e.g., titanium or tantalum). The spacer 420 may surround the common source contact 410. For example, the spacer 420 may be and/or include an insulating material (e.g., a silicon oxide layer or a silicon nitride layer).

Common source regions CSR may be disposed in the substrate 100 and may lie under the first to fourth contact structures 400a to 400d, respectively. The common source regions CSR may be electrically connected to the common source contacts 410 of the first to fourth contact structures 400a to 400d, respectively. The common source regions CSR may have a different conductivity type from that of the substrate 100.

A third interlayer insulating layer ILD3 may be disposed on the second interlayer insulating layer ILD2. The third interlayer insulating layer ILD3 may cover a top surface of the second interlayer insulating layer ILD2 and top surfaces of the first to fourth contact structures 400a to 400d. For example, the third interlayer insulating layer ILD3 may be and/or include a silicon oxide layer.

Channel contact plugs CCP may be disposed on the pads 360. The channel contact plugs CCP may penetrate the third and second interlayer insulating layers ILD3 and ILD2 so as to be connected to the pads 360, respectively. For example, the channel contact plugs CCP may include at least one of a conductive metal (e.g., copper or tungsten) and a metal nitride (e.g., TiN, TaN, or WN).

Cell contact plugs 510 may be disposed on the stair structures STS of the first to fourth stack structures ST1a to ST4a and ST1 to ST4. For example, the cell contact plugs 510 may be disposed on the end portions of the gate electrodes 320a, 320b and 320c. The cell contact plugs 510 may contact and be connected to the gate electrodes 320a, 320b and 320c. The cell contact plugs 510 may include at least one of a conductive metal (e.g., copper or tungsten) and a metal nitride (e.g., TiN, TaN, or WN).

First peripheral contact plugs PCP1 may be disposed in the first separation structure SRS1. For example, the first peripheral contact plugs PCP1 may penetrate the third interlayer insulating layer ILD3, the second interlayer insulating layer ILD2, the mold structure MS, and the substrate 100. The first peripheral contact plugs PCP1 may extend into peripheral circuit interlayer insulating layer 210 and contact and be connected to the interconnection conductors 213 of the peripheral circuit structure PRS. The first peripheral contact plugs PCP1 may be electrically connected to corresponding transistors TR of the peripheral circuit structure PRS by wiring formed by interconnection conductors 213 and vias 215. Second peripheral contact plugs PCP2 may be disposed on the second peripheral circuit region PR2 of the substrate 100. For example, the second peripheral contact plugs PCP2 may penetrate the third interlayer insulating layer ILD3, the second interlayer insulating layer ILD2, the first interlayer insulating layer ILD1, and the substrate 100. The second peripheral contact plugs PCP2 may extend into peripheral circuit interlayer insulating layer 210 and contact and be connected to the interconnection conductors 213. The second peripheral contact plugs PCP2 may be electrically connected to corresponding transistors TR of the peripheral circuit structure PRS by wiring formed by interconnection conductors 213 and vias 215.

Spacers (not shown) may be disposed between the substrate 100 and the first peripheral contact plugs PCP1 and between the substrate 100 and the second peripheral contact plugs PCP2. The first and second peripheral contact plugs PCP1 and PCP2 may be spaced apart from the substrate 100 by the spacers. For example, the first and second peripheral contact plugs PCP1 and PCP2 may be electrically insulated from the substrate 100 by the spacers. Each of the spacers may be an insulating layer surrounding a corresponding one of the first and second peripheral contact plugs PCP1 and PCP2.

Second to fifth contact plugs 610b, 610c, 610d and 610e may be disposed in the first separation structure SRS1. For example, the second to fifth contact plugs 610b, 610c, 610d and 610e may penetrate the third interlayer insulating layer ILD3, the second interlayer insulating layer ILD2, and the mold structure MS. Bottom surfaces 611 of the second to fifth contact plugs 610b, 610c, 610d and 610e may be in contact with the substrate 100. The bottom surfaces 611 of the second to fifth contact plugs 610b, 610c, 610d and 610e may be located at substantially the same level as the top surface of the substrate 100 or may be located below the top surface of the substrate 100 (e.g., at a level between the top surface and a bottom surface of the substrate 100). The second to fifth contact plugs 610b, 610c, 610d and 610e may contact and be electrically connected to the substrate 100. For example, referring to FIGS. 3B and 4, the second contact plugs 610b may be arranged in the mold structure MS along sidewalls of the first and second end portions EP1 and EP2 of the first stack structure block STB1 when viewed in a plan view. The third contact plugs 610c may be arranged along sidewalls of the first and second end portions EP1 and EP2 of the second stack structure block STB2 when viewed in a plan view. The fourth contact plugs 610d may be arranged along sidewalls of the first and second end portions EP1 and EP2 of the third stack structure block STB3 when viewed in a plan view. The fifth contact plugs 610e may be arranged along sidewalls of the first and second end portions EP1 and EP2 of the fourth stack structure block STB4 when viewed in a plan view. The second to fifth contact plugs 610b, 610c, 610*d* and 610*e* disposed in the mold structure MS may be spaced apart from each other. The second to fifth contact plugs 610*b*, 610*c*, 610*d* and 610*e* may include the same material as the channel contact plugs CCP. For example, the contact plugs 610*a* to 610*e* may include at least one of a conductive metal (e.g., copper or tungsten) and a metal nitride (e.g., TiN, TaN, or WN).

Connection lines EC may be disposed on the third interlayer insulating layer ILD3. Each of the connection lines EC may connect a corresponding one of the second to fifth contact plugs 610*b* to 610*e* and a corresponding one of the first peripheral contact plugs PCP1. Thus, the second to fifth contact plugs 610*b* to 610*e* may be electrically connected to the transistors TR formed with the lower substrate 200 through the connection lines EC and the first peripheral contact plugs PCP1.

According to the embodiments of the inventive concepts, in combination with the first contact plugs 610*a*, the second to fifth contact plugs 610*b*, 610*c*, 610*d* and 610*e* may be arranged to surround the stack structure blocks STB1, STB2, STB3 and STB4, respectively, and thus a resistance of an electrical connection to the substrate 100 may be reduced. As a result, an operating performance of the 3D semiconductor memory device may be improved.

Interconnection lines ICN may be disposed on the third interlayer insulating layer ILD3. The interconnection lines ICN may be connected to the cell contact plugs 510 and the second peripheral contact plugs PCP2. Bit lines BL1 and BL2 may be disposed on the third interlayer insulating layer ILD3. The bit lines BL1 and BL2 may include first bit lines BL1 intersecting the first stack structures ST1 and ST1*a*, second bit lines BL2 intersecting the second stack structures ST2 and ST2*a*, third bit lines (not shown) intersecting the third stack structures ST3 and ST3*a*, and fourth bit lines (not shown) intersecting the fourth stack structures ST4 and ST4*a*. The first to fourth bit lines BL1 and BL2 may extend in the first direction X and may be spaced apart from each other.

The first and second bit lines BL1 and BL2 facing each other in the first direction X may be aligned with each other and may be spaced apart from each other. The first and second bit lines BL1 and BL2 may not be electrically connected to each other. The third and fourth bit lines facing each other in the first direction X may be aligned with each other and may be spaced apart from each other. The third and fourth bit lines may not be electrically connected to each other.

Figure 8:
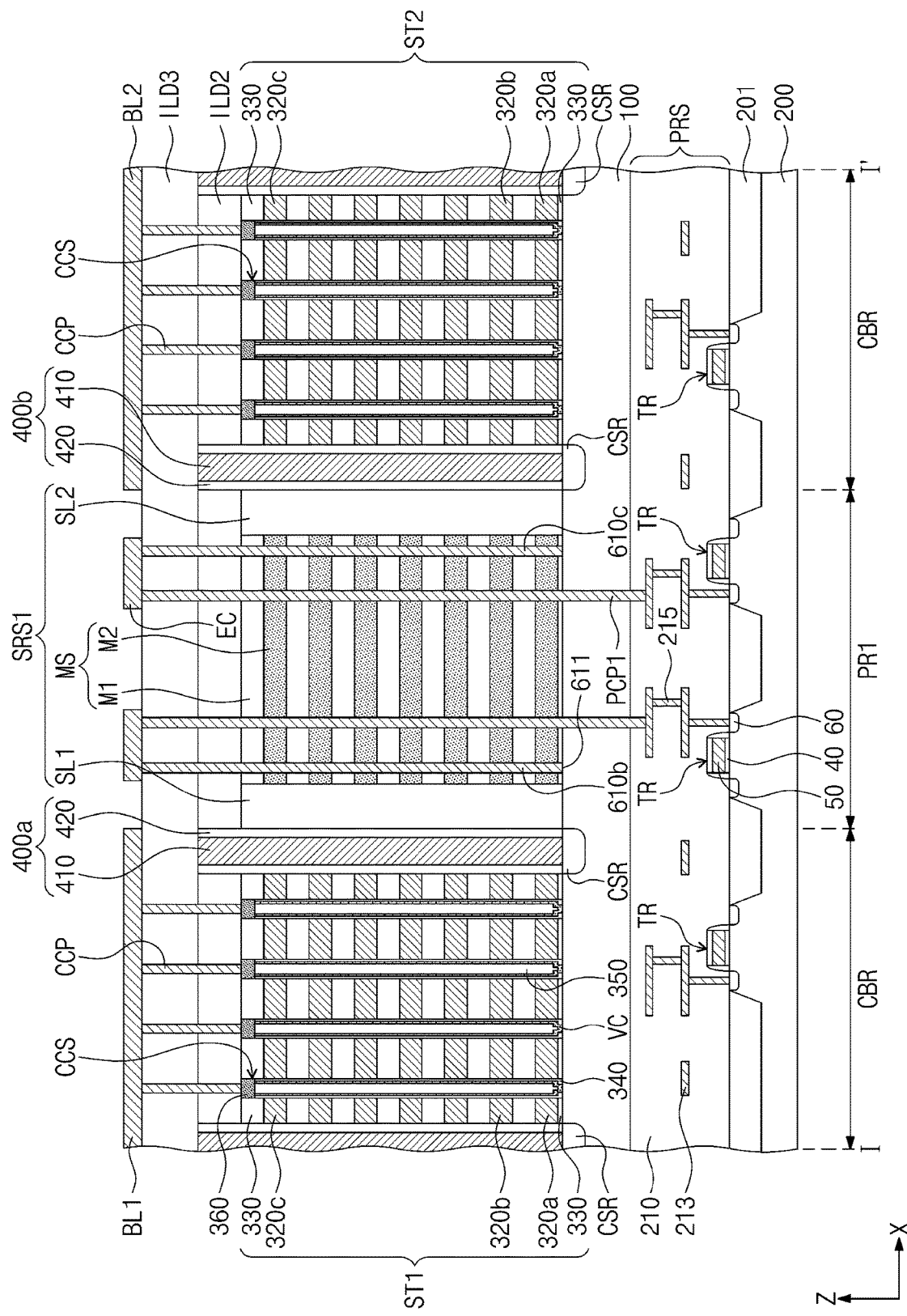
FIG. 8 is a cross-sectional view taken along the line I-I' of FIG. 4 to illustrate a 3D semiconductor memory device according to some embodiments of the inventive concepts.

FIG. 8 is a cross-sectional view taken along the line I-I' of FIG. 4 to illustrate a 3D semiconductor memory device according to some embodiments of the inventive concepts.

Referring to FIG. 8, vertical channel portions VC and charge storage structures 340 may extend to and be in contact with the top surface of the substrate 100. In the embodiment of FIG. 8, the semiconductor pillars SP and the gate insulating layers 370 described with reference to FIGS. 4 to 7 may be omitted. Other structure of the embodiment of FIG. 8 may be the same as that described with respect to FIGS. 1 to 7 and/or the same as any one of the alternative embodiments of FIGS. 1 to 7.

Figure 9:
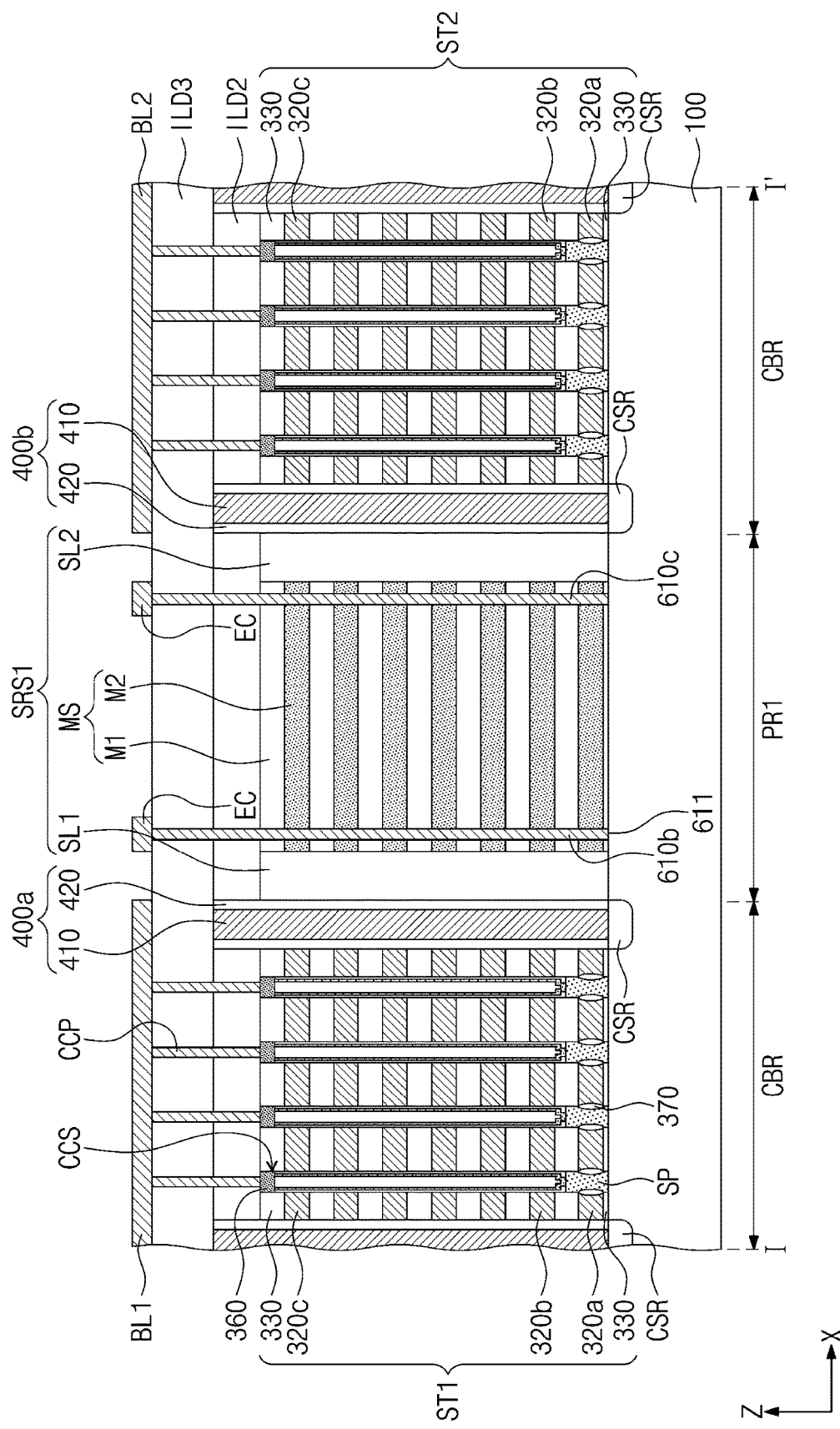
FIG. 9 is a cross-sectional view taken along the line I-I' of FIG. 4 to illustrate a 3D semiconductor memory device according to some embodiments of the inventive concepts.
Figure 10:
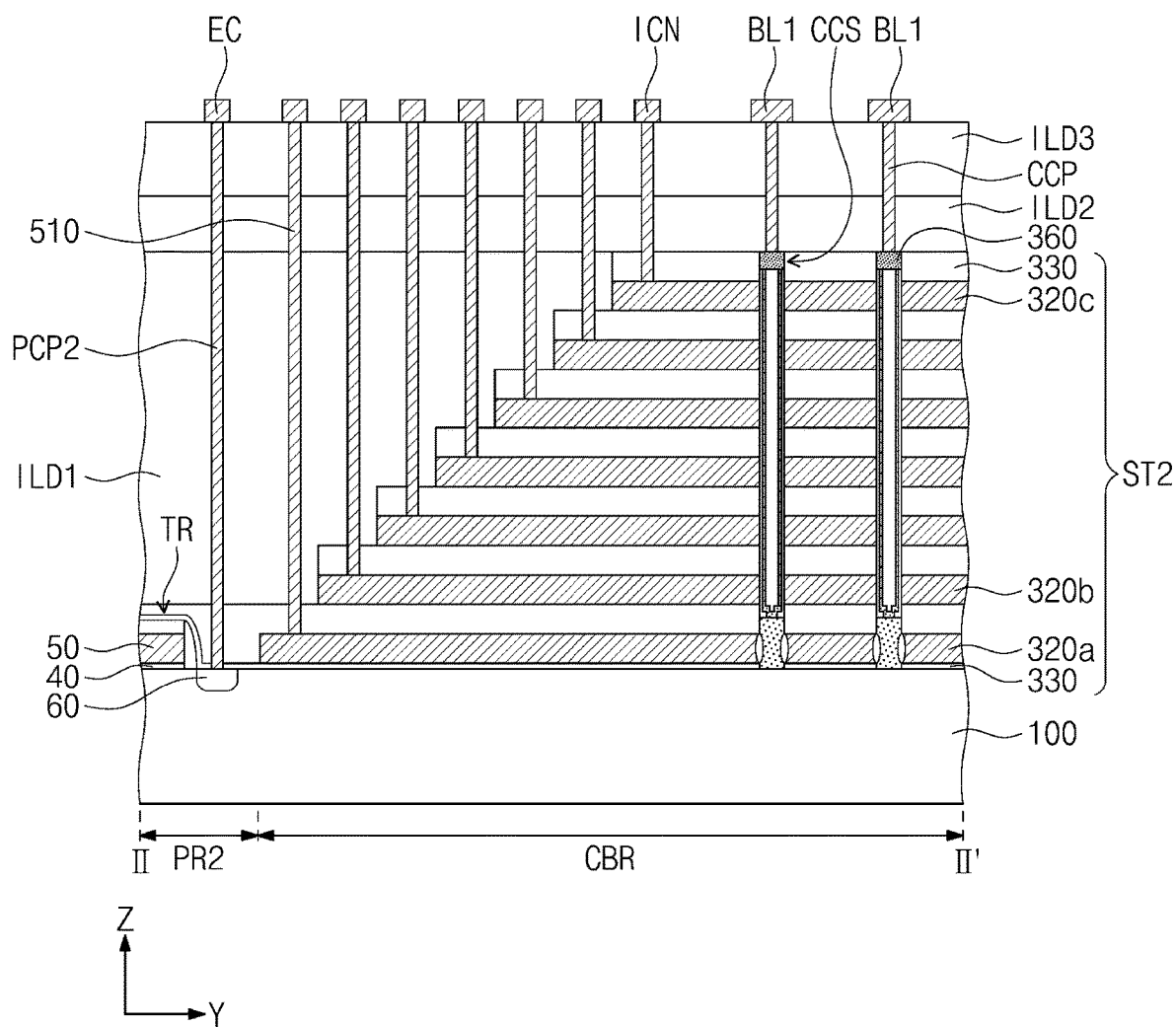
FIG. 10 is a cross-sectional view taken along the line II-II' of FIG. 4 to illustrate a 3D semiconductor memory device according to some embodiments of the inventive concepts.

FIG. 9 is a cross-sectional view taken along the line I-I' of FIG. 4 to illustrate a 3D semiconductor memory device according to some embodiments of the inventive concepts. FIG. 10 is a cross-sectional view taken along the line II-II' of FIG. 4 to illustrate a 3D semiconductor memory device according to some embodiments of the inventive concepts.

Referring to FIGS. 9 and 10, a transistor TR may be disposed on and/or in the second peripheral circuit region PR2 of the substrate 100. A top of the transistor TR may be disposed at a level between the ground selection gate electrode 320*a* and a lowermost cell gate electrode 320*b*, and the transistor TR may be covered by the insulating pattern 330 extending onto a top surface of the second peripheral circuit region PR2 of the substrate 100. The lower substrate 200 and the peripheral circuit structure PRS formed on the lower substrate 200 may be omitted in the present embodiment of FIGS. 9 and 10. The first peripheral contact plugs PCP1 may not be disposed in the first separation structure SRS1. The second peripheral contact plug PCP2 may penetrate the third, second and first interlayer insulating layers ILD3, ILD2 and ILD1 and the insulating pattern 330 extending onto the second peripheral circuit region PR2 and may be electrically connected to a source/drain region 60 of the transistor TR, which is disposed in the substrate 100.

Second to fifth contact plugs 610*b*, 610*c*, 610*d* and 610*e* may be disposed in the mold structure MS of the first separation structure SRS1. The second to fifth contact plugs 610*b*, 610*c*, 610*d* and 610*e* may penetrate the third interlayer insulating layer ILD3, the second interlayer insulating layer ILD2, and the mold structure MS. Connection lines EC may be disposed on the third interlayer insulating layer ILD3. The connection lines EC may connect the second peripheral contact plugs PCP2 to the second to fifth contact plugs 610*b* to 610*e*. The first to fifth contact plugs 610*a* to 610*e* may be electrically connected to the transistors TR disposed on the second peripheral circuit region PR2 of the substrate 100. Other structure of the embodiment of FIGS. 9 and 10 may be the same as that described with respect to FIGS. 1 to 7 and/or the same as any one of the alternative embodiments of FIGS. 1 to 7.

Figure 11:
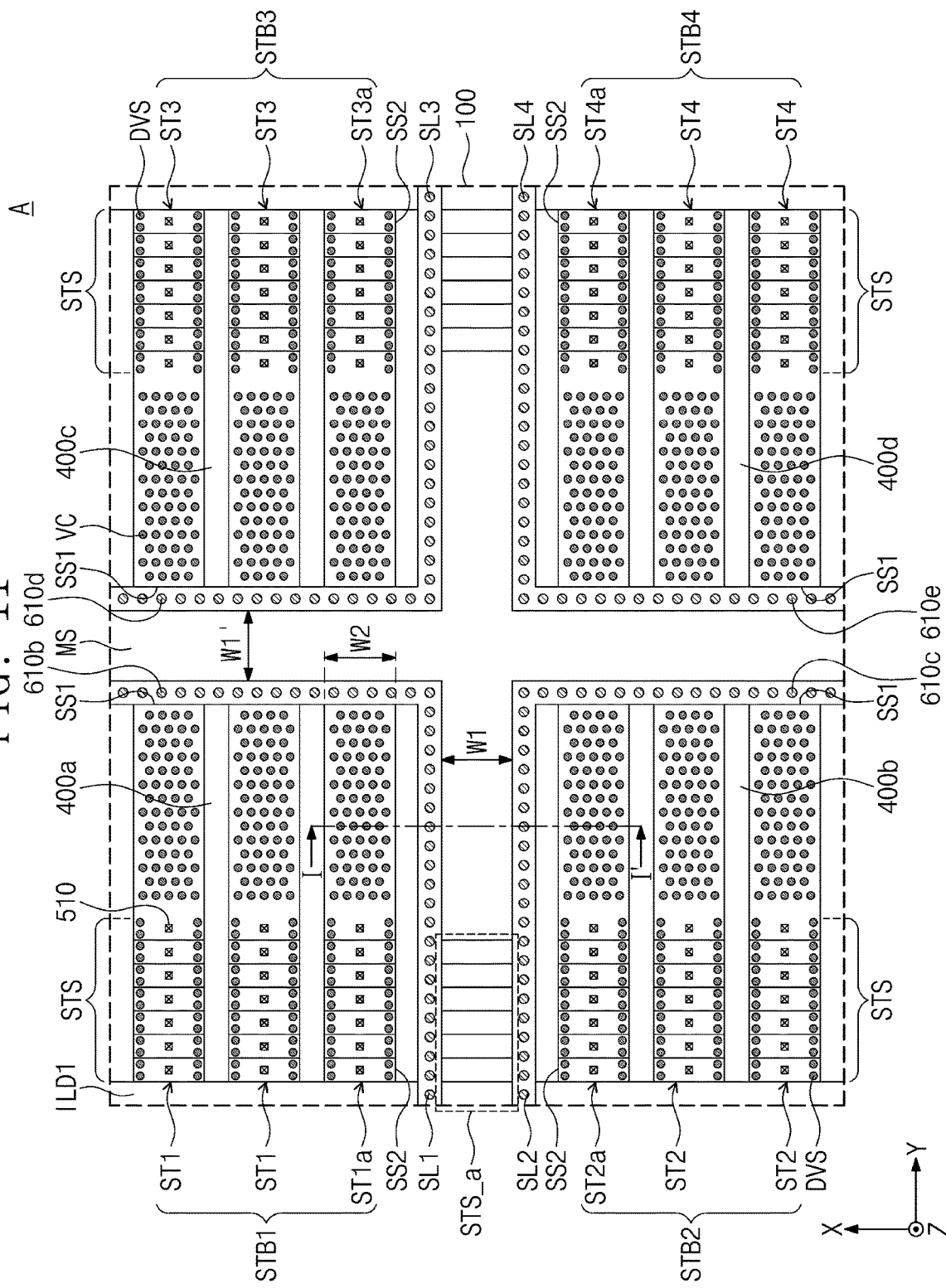
FIG. 11 is an enlarged view of the portion 'A' of FIG. 3A.
Figure 12:
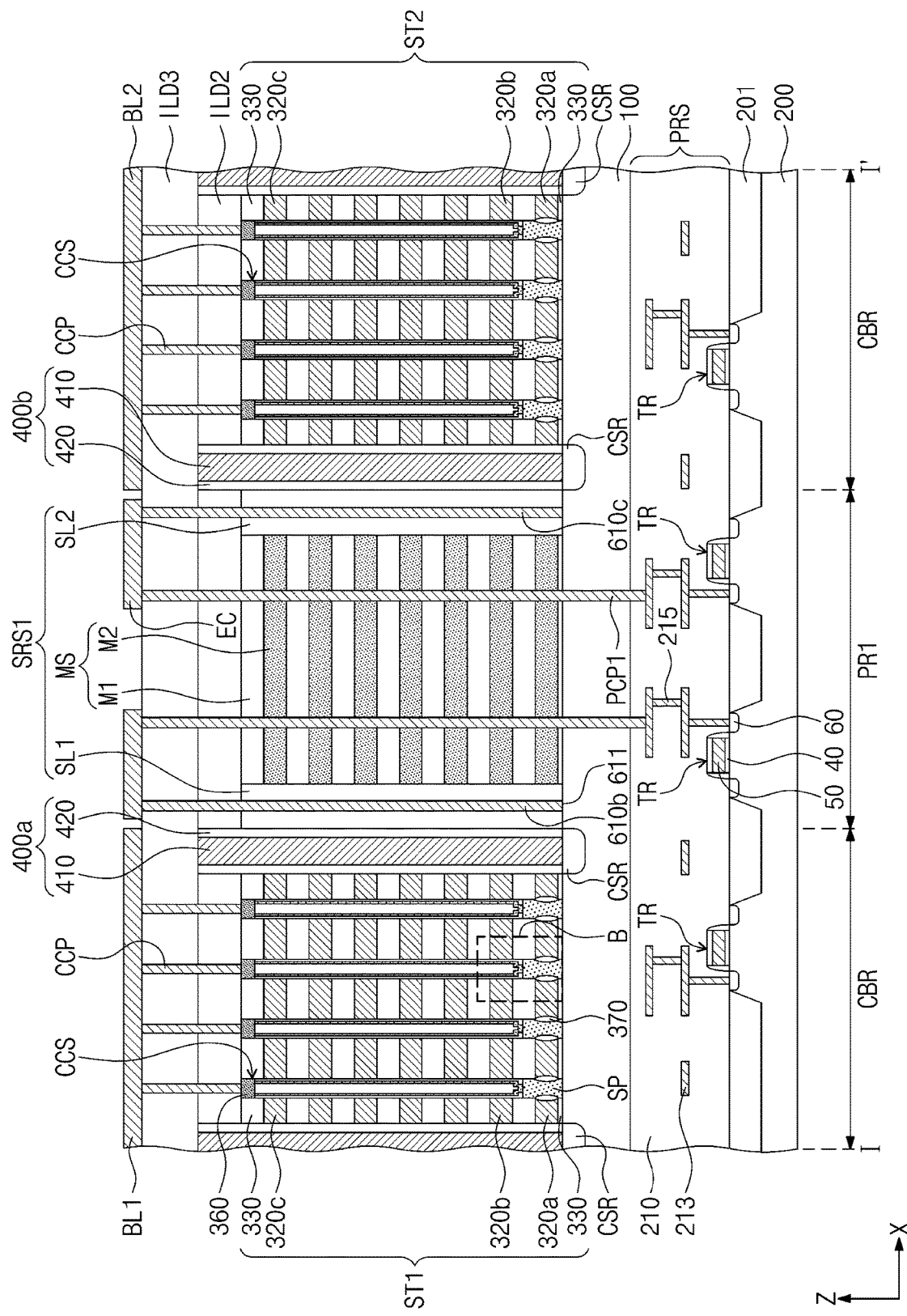
FIG. 12 is a cross-sectional view taken along a line I-I' of FIG. 11 to illustrate a 3D semiconductor memory device according to some embodiments of the inventive concepts.

FIG. 11 is an enlarged view of the portion 'A' of FIG. 3A. FIG. 12 is a cross-sectional view taken along a line I-I' of FIG. 11 to illustrate a 3D semiconductor memory device according to some embodiments of the inventive concepts.

Referring to FIGS. 11 and 12, second to fifth contact plugs 610*b*, 610*c*, 610*d* and 610*e* may be disposed in the first to fourth separation layers SL1, SL2, SL3 and SL4. For example, the second contact plugs 610*b* may be arranged in a line along the first separation layer SL1, and the third contact plugs 610*c* may be arranged in a line along the second separation layer SL2. The fourth contact plugs 610*d* may be arranged in a line along the third separation layer SL3, and the fifth contact plugs 610*e* may be arranged in a line along the fourth separation layer SL4. Other structure of the embodiment of FIGS. 11 and 12 may be the same as that described with respect to FIGS. 1 to 7 and/or the same as any one of the alternative embodiments of FIGS. 1 to 7.

Figure 13:
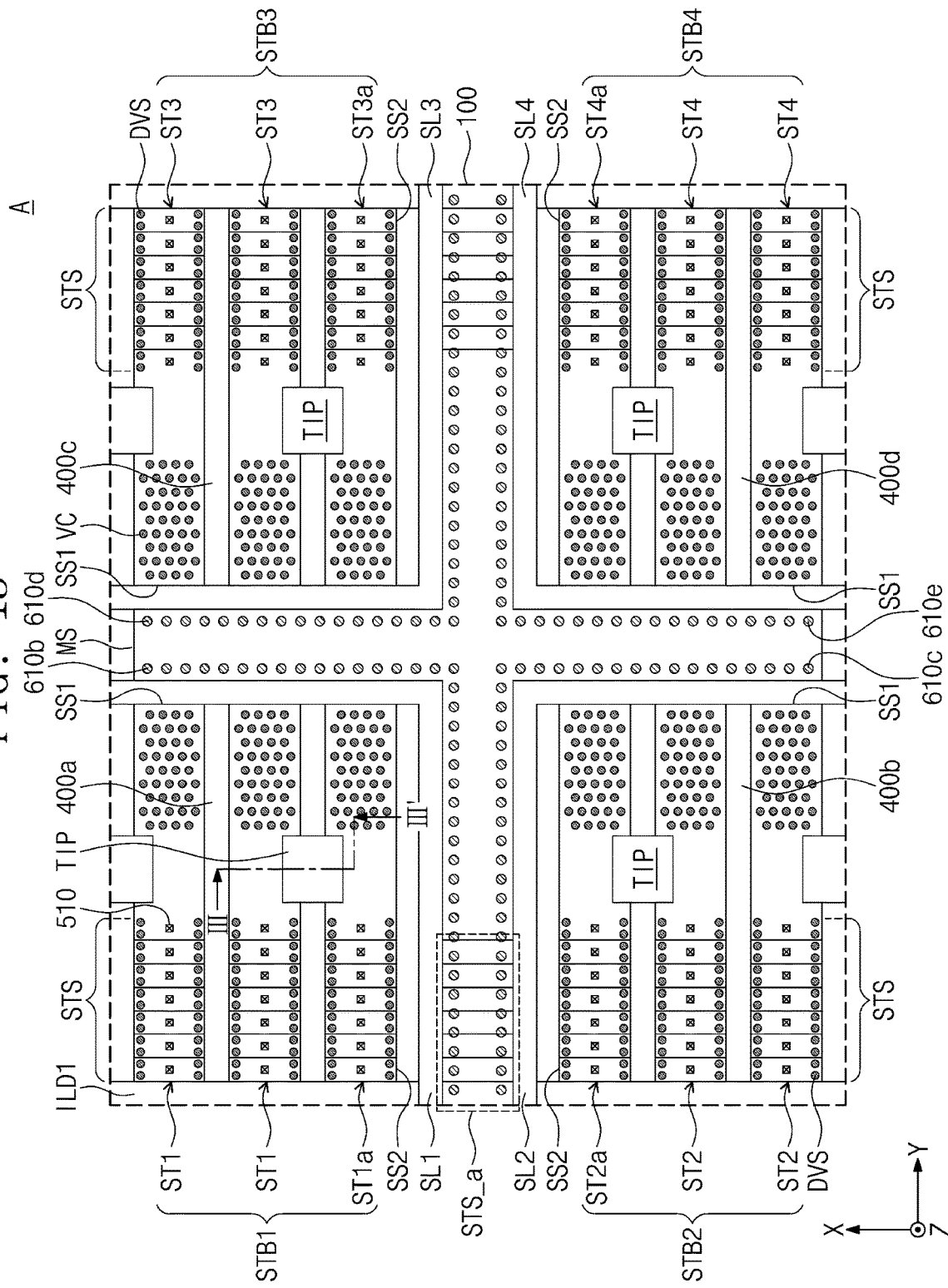
FIG. 13 is an enlarged view of the portion 'A' of FIG. 3A.
Figure 14:
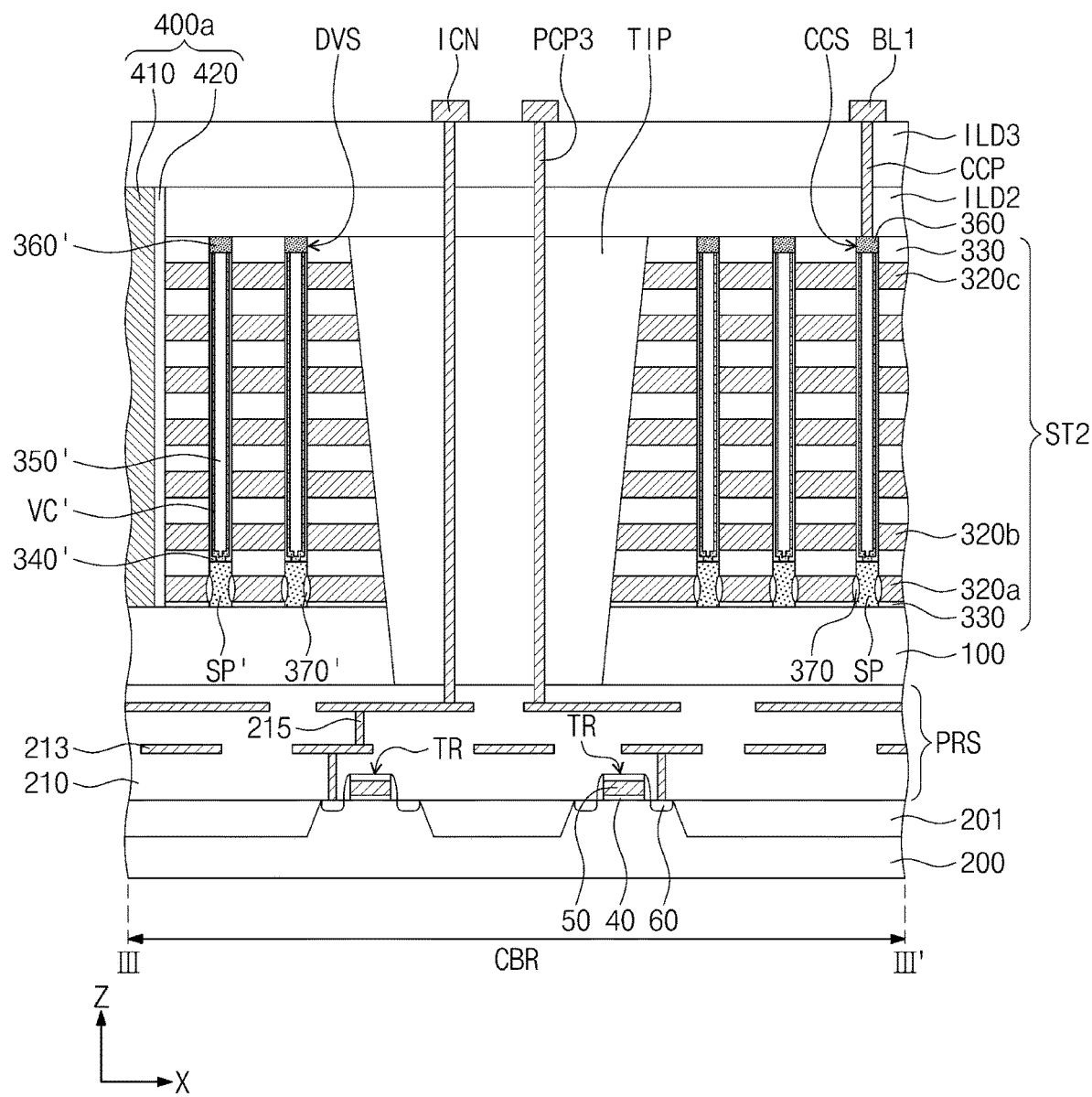
FIG. 14 is a cross-sectional view taken along a line III-III' of FIG. 13 to illustrate a 3D semiconductor memory device according to some embodiments of the inventive concepts.

FIG. 13 is an enlarged view of the portion 'A' of FIG. 3A. FIG. 14 is a cross-sectional view taken along a line III-III' of FIG. 13 to illustrate a 3D semiconductor memory device according to some embodiments of the inventive concepts.

Referring to FIGS. 13 and 14, through-insulating patterns TIP may penetrate a pair of the first stack structures ST1 and ST1*a* adjacent to each other in the first direction X, a pair of the second stack structures ST2 and ST2*a* adjacent to each other in the first direction X, a pair of the third stack structures ST3 and ST3*a* adjacent to each other in the first direction X, and a pair of the fourth stack structures ST4 and ST4*a* adjacent to each other in the first direction X. The through-insulating patterns TIP may penetrate the substrate 100 and may be in contact with a top surface of the peripheral circuit structure PRS. Each of the through-insulating patterns TIP may be disposed between the cell contact plug 510 connected to the string selection gate electrode 320c and the vertical channel portions VC when viewed in a plan view. Sidewalls of the through-insulating patterns TIP may be inclined with respect to the top surface of the substrate 100. For example, the through-insulating patterns TIP may be a high-density plasma (HDP) oxide layer, a tetraethylorthosilicate (TEOS) layer, a plasma enhanced tetraethylorthosilicate (PE-TEOS) layer, an $O_3$-tetraethylorthosilicate ($O_3$-TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin on glass (SOG) layer, a Tonen silazene (TOSZ) layer, or any combination thereof.

Even though not shown in the drawings, dummy channel structures DVS may surround the through-insulating patterns TIP in a plan view and may penetrate the first to fourth stack structures ST1a to ST4a and ST1 to ST4. Each of the dummy channel structures DVS may include a dummy semiconductor pillar SP', a dummy vertical channel portion VC', a dummy charge storage structure 340', a dummy gap-fill layer 350', and a dummy pad 360'. The dummy channel structures DVS may have identical structure as that of vertical channel portions VC, charge storage structures 340 and gap-fill layers 350 described herein (e.g., as described with respect to FIG. 5 or FIG. 8). The dummy channel structures DVS also may have identical structure as that of the semiconductor pillars (e.g., when implemented with the structure of FIG. 5). The dummy channel structures DVS may not be connected to any bit line BL or otherwise be connected to input and/or output data. For example, channel contact plugs CCP may not be disposed on top surfaces of the dummy pads 360' of the dummy channel structures DVS. Dummy pads 360' may be covered by second interlayer insulating layer ILD2. A dummy gate insulating layer 370' may be disposed between the dummy semiconductor pillar SP' and the ground selection gate electrode 320a.

Third peripheral contact plugs PCP3 may penetrate the through-insulating patterns TIP and the substrate 100 and may be connected to interconnection conductors 213 of the peripheral circuit structure PRS. The third peripheral contact plugs PCP3 may be connected to interconnection lines ICN disposed on a top surface of the third interlayer insulating layer ILD3. Other structure of the embodiment of FIGS. 13 and 14 may be the same as that described with respect to FIGS. 1 to 7 and/or the same as any one of the alternative embodiments of FIGS. 1 to 7.

Figure 15:
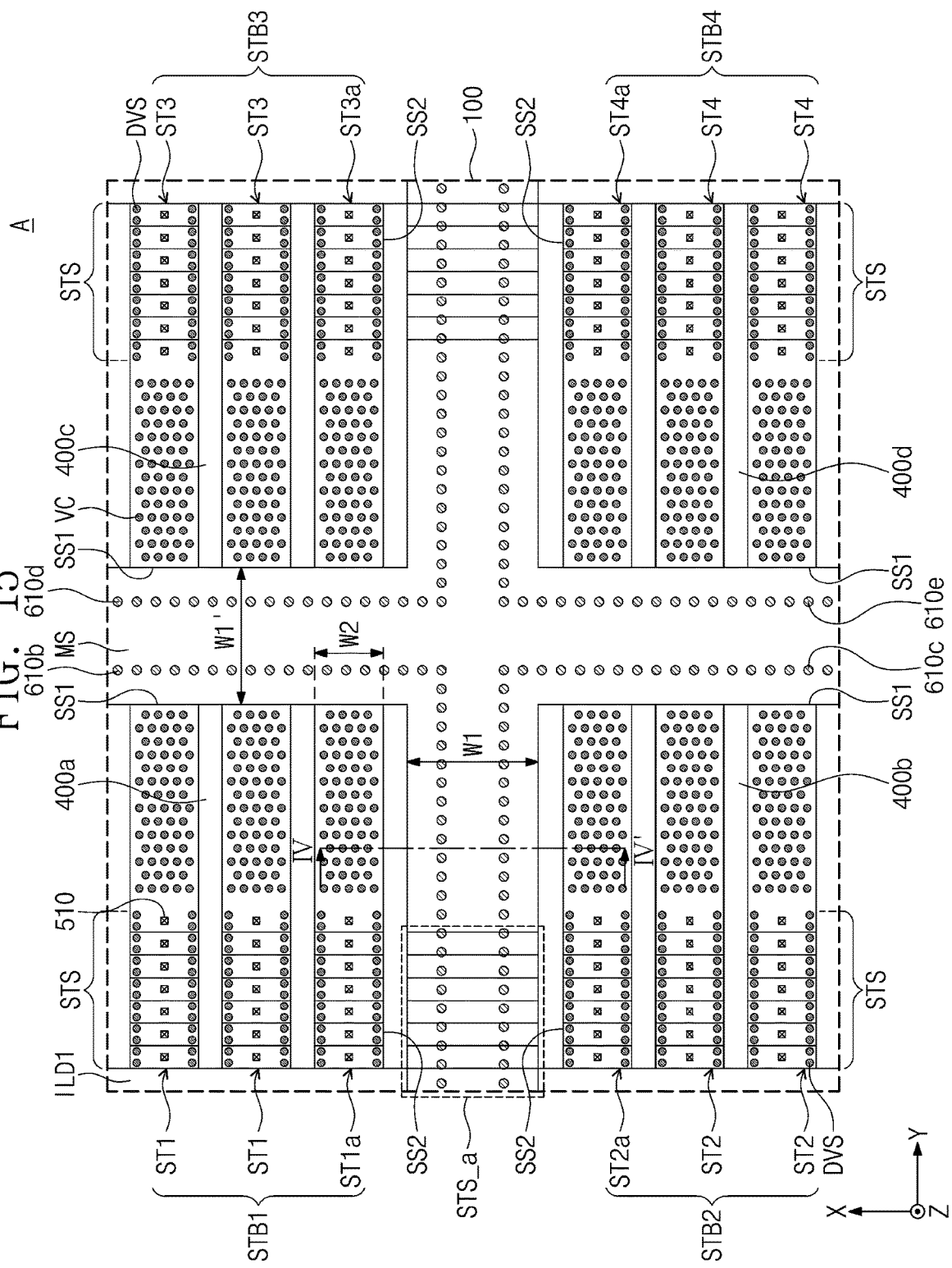
FIG. 15 is an enlarged view of the portion 'A' of FIG. 3A.
Figure 16:
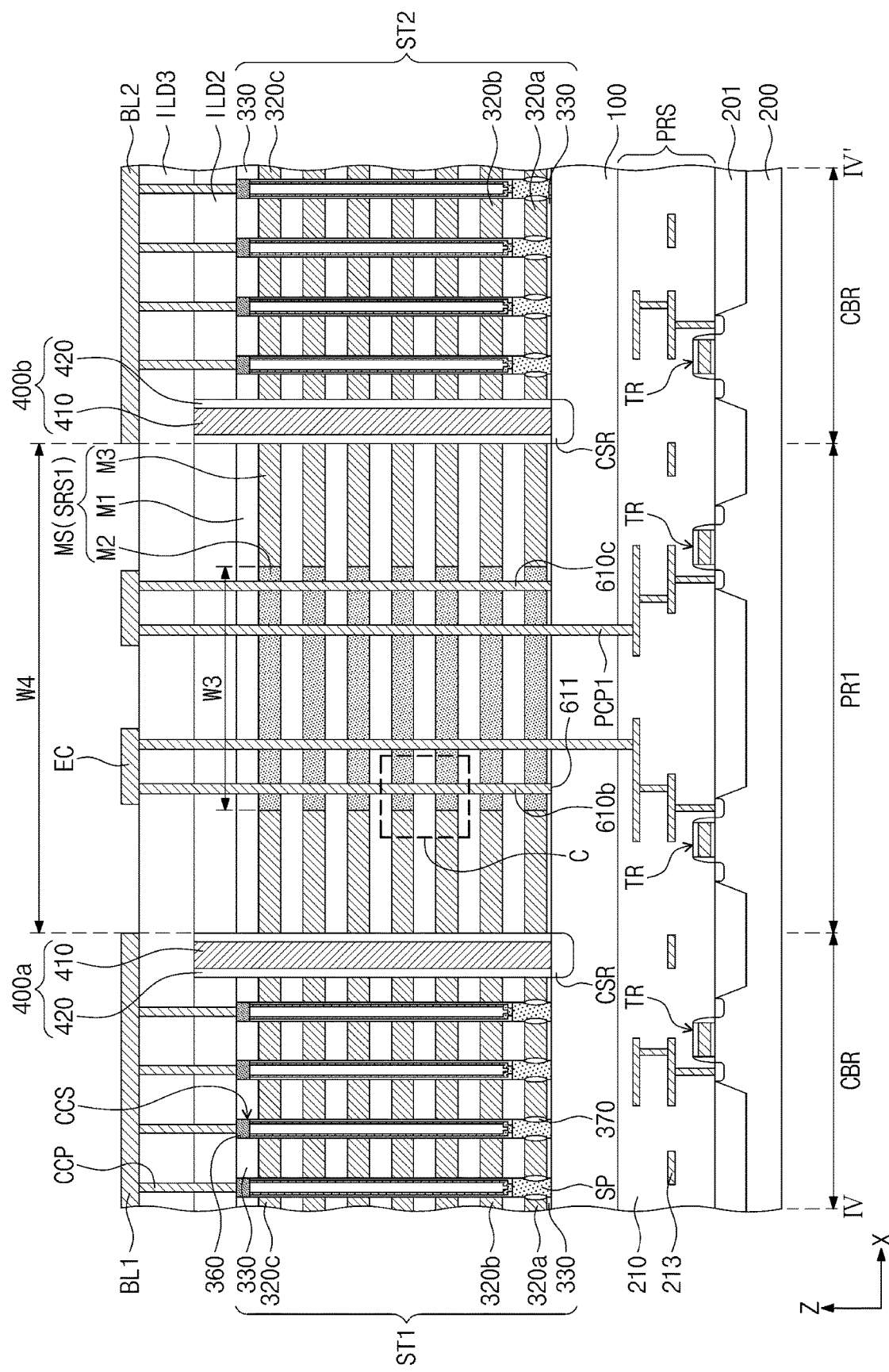
FIG. 16 is a cross-sectional view taken along a line IV-IV' of FIG. 15 to illustrate a 3D semiconductor memory device according to some embodiments of the inventive concepts.
Figure 17:
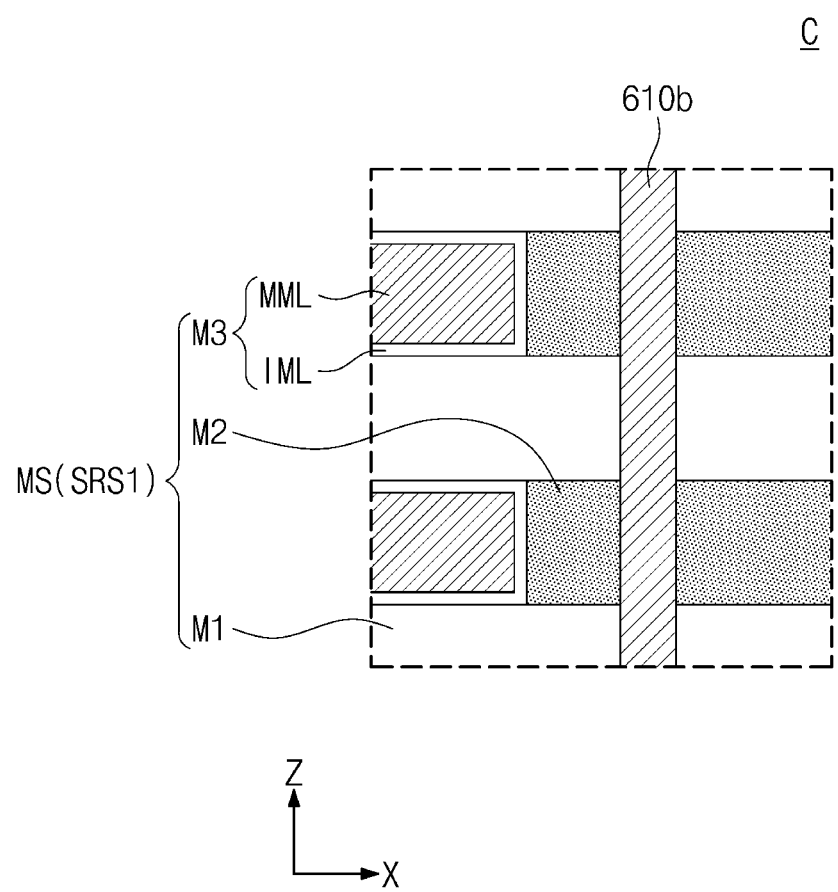
FIG. 17 is an enlarged view of a portion 'C' of FIG. 16.

FIG. 15 is an enlarged view of the portion 'A' of FIG. 3A. FIG. 16 is a cross-sectional view taken along a line IV-IV' of FIG. 15 to illustrate a 3D semiconductor memory device according to some embodiments of the inventive concepts. FIG. 17 is an enlarged view of a portion 'C' of FIG. 16.

Referring to FIGS. 15 to 17, the first contact structure 400a between the first stack structure ST1a and the first separation structure SRS1, the second contact structure 400b between the second stack structure ST2a and the first separation structure SRS1, the third contact structure 400c between the third stack structure ST3a and the first separation structure SRS1, and the fourth contact structure 400d between the fourth stack structure ST4a and the first separation structure SRS1 may be in contact with the mold structure MS of the first separation structure SRS1. The first to fourth separation layers SL1 to SL4 may be omitted in the first separation structure SRS1 in the present embodiment of FIGS. 15 to 17. The first separation structure SRS1 (i.e., the mold structure MS) may include first mold layers M1 stacked in the third direction Z, second mold layers M2 disposed between the first mold layers M1, and third mold layers M3. Sidewalls of the second mold layers M2 may be laterally recessed from sidewalls of the first mold layers M1. For example, widths W3 of the second mold layers M2 in the first direction X may be less than widths W4 of the first mold layers M1 in the first direction X (W3<W4).

The third mold layers M3 may be disposed at both sides of each of the second mold layers M2 between the first mold layers M1 adjacent to each other in the third direction Z. One sidewall of each of the third mold layers M3 may be in contact with each of the second mold layers M2. Another sidewall, opposite to the one sidewall, of each of the third mold layers M3 may be aligned with the sidewalls of the first mold layers M1 and contact a contact structure 400a, 400b, 400c or 400d. Each of the third mold layers M3 may include an insulating mold layer IML and a metal mold layer MML. The metal mold layer MML may be disposed between neighboring ones of the first mold layers M1 (adjacent to each other in the third direction Z). The insulating mold layer IML may be disposed between the metal mold layer MML and the second mold layer M2 and may extend onto a top surface and a bottom surface of the metal mold layer MML. The insulating mold layer IML may be formed of the same material as the horizontal insulating layer 380 of FIG. 7. The metal mold layer MML may be formed of the same material as the gate electrodes 320a, 320b and 320c. First peripheral contact plugs PCP1 disposed in the mold structure MS may penetrate the first and second mold layers M1 and M2 and may be spaced apart from the third mold layers M3. Second to fifth contact plugs 610b, 610c, 610d and 610e disposed in the mold structure MS may penetrate the first and second mold layers M1 and M2 and may be spaced apart from the third mold layers M3.

The mold structure MS may be in contact with the first to fourth stack structures ST1a to ST4a and ST1 to ST4. For example, the first to fourth stack structures ST1a to ST4a and ST1 to ST4 may be in contact with the first mold layers M1 and the third mold layers M3 of the mold structure MS. The first to fourth stack structures ST1a to ST4a and ST1 to ST4 may be spaced apart from the second mold layers M2 of the mold structure MS. In some embodiments, a width W1 of the mold structure MS in the first direction X and a width W1' of the mold structure MS in the second direction Y may be greater than the widths W2, in the first direction X, of the first to fourth stack structures ST1a to ST4a and ST1 to ST4 (W1, W1'>W2). Other structure of the embodiment of FIGS. 15 and 17 may be the same as that described with respect to FIGS. 1 to 7 and/or the same as any one of the alternative embodiments of FIGS. 1 to 7.

Figure 18:
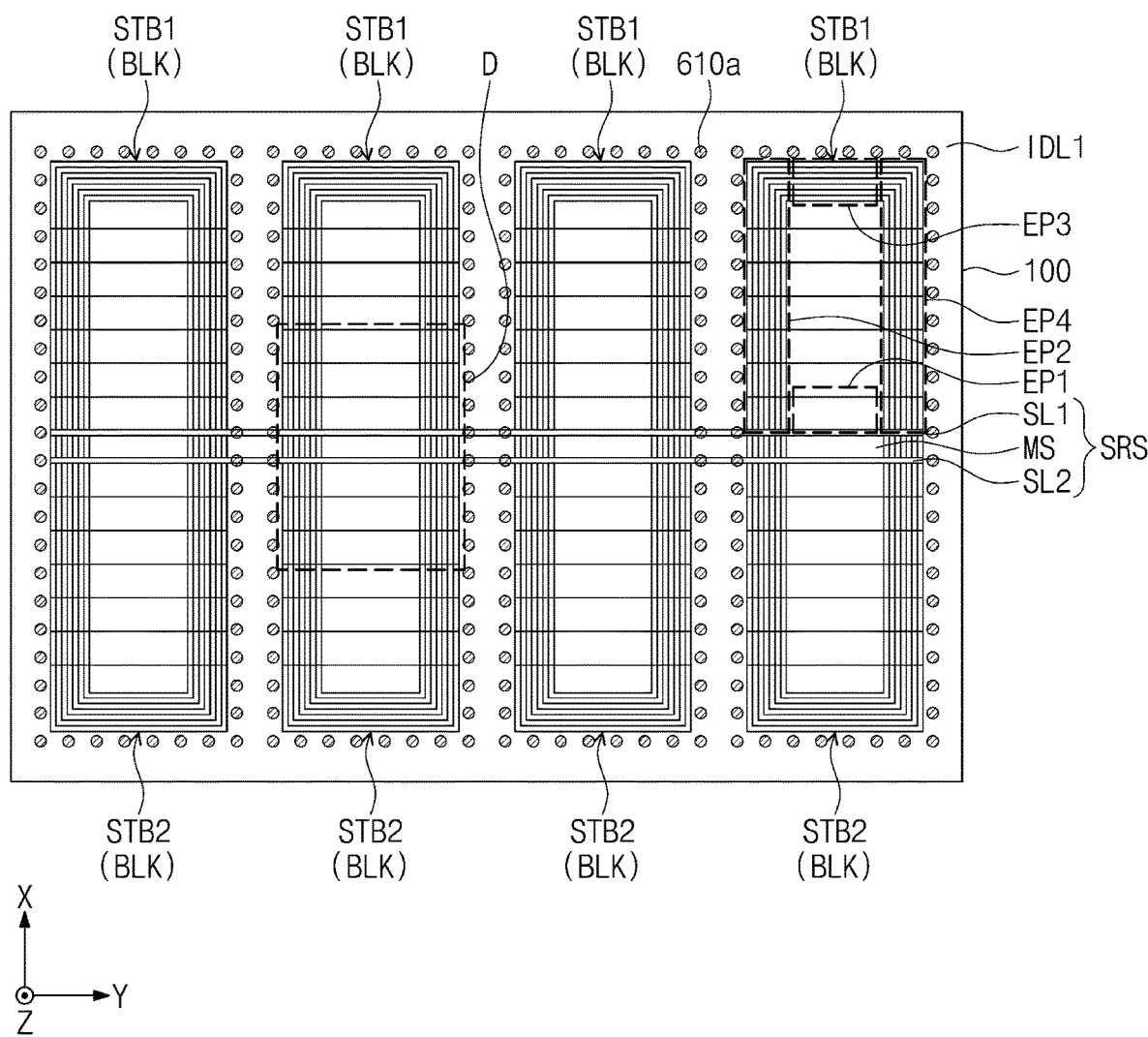
FIG. 18 is an enlarged view of a semiconductor chip of FIG. 2.
Figure 19:
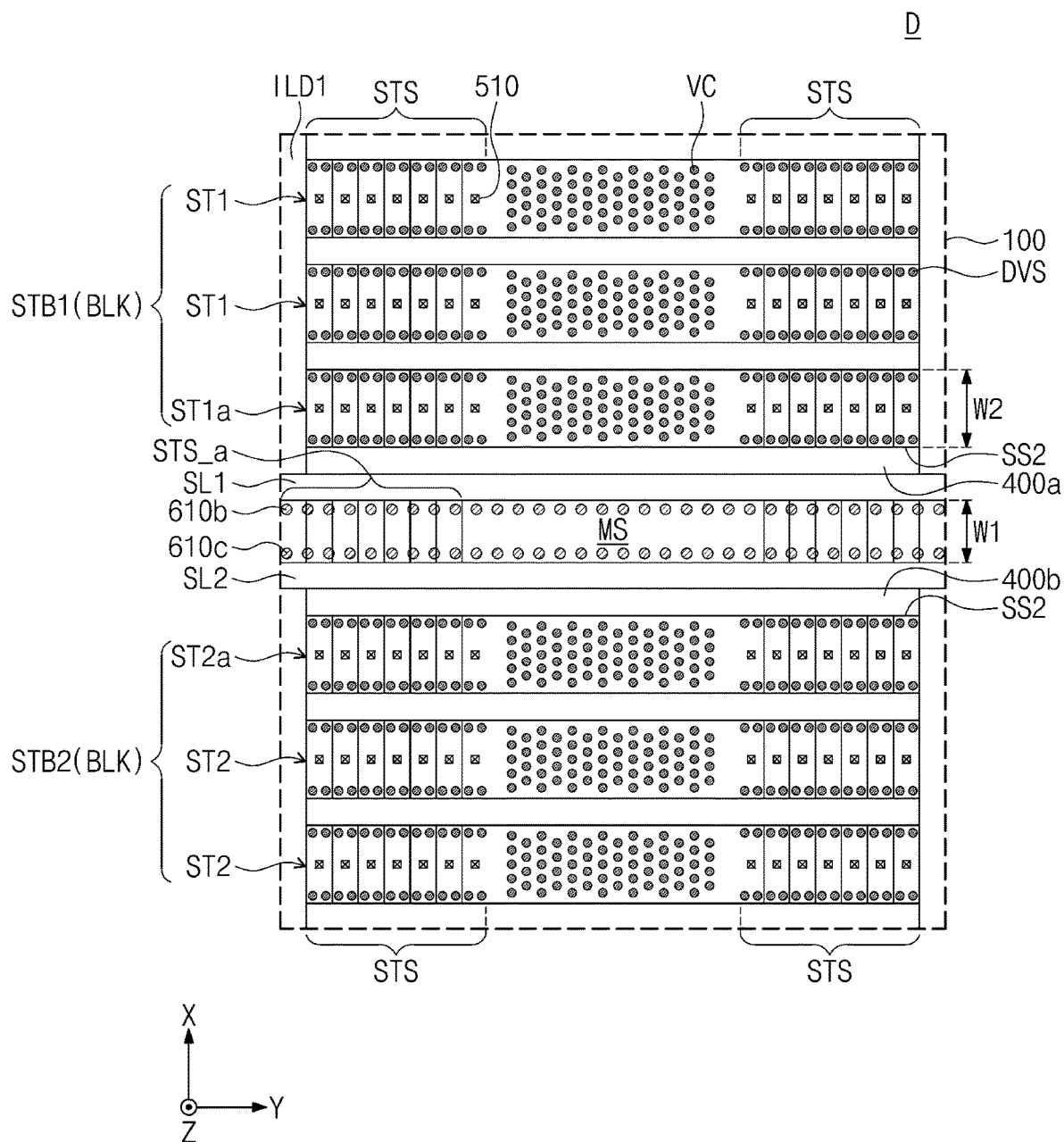
FIG. 19 is an enlarged view of a portion 'D' of FIG. 18.

FIG. 18 is an enlarged view of a semiconductor chip of FIG. 2. FIG. 19 is an enlarged view of a portion 'D' of FIG. 18.

Referring to FIGS. 18 and 19, each of semiconductor chips USC may include a substrate 100, blocks BLK disposed on a top surface of the substrate 100, and a first interlayer insulating layer ILD1. The blocks BLK may be spaced apart from each other in the second direction Y on the top surface of the substrate 100. The first interlayer insulating layer ILD1 may cover sidewalls of the blocks BLK on the top surface of the substrate 100. Each of the blocks BLK may include a first stack structure block STB1, a second stack structure block STB2, and a separation structure SRS. The first stack structure block STB1 and the second stack structure block STB2 may be spaced apart from each other in the first direction X on the top surface of the substrate 100. The first stack structure blocks STB1 of the blocks BLK may be spaced apart from each other in the second direction Y, and the second stack structure blocks STB2 of the blocks BLK may be spaced apart from each other in the second direction Y.

The separation structure SRS may be disposed between the first stack structure block STB1 and the second stack structure block STB2. The separation structure SRS may extend in the second direction Y on the top surface of the substrate 100 to penetrate the first interlayer insulating layer ILD1 disposed between the blocks BLK.

The separation structure SRS may include mold structures MS, a first separation layer SL1, and a second separation layer SL2. Each of the mold structures MS may be disposed between the first and second stack structure blocks STB1 and STB2 facing each other in the first direction X. The mold structures MS may be spaced apart from each other in the second direction Y. The first separation layer SL1 may extend in the second direction Y from between each of the mold structures MS and each of the first stack structure blocks STB1. The first separation layer SL1 may extend in the second direction Y and penetrate the first interlayer insulating layer ILD1. The second separation layer SL2 may extend in the second direction Y from between each of the mold structures MS and each of the second stack structure blocks STB2. The second separation layer SL2 may extend in the second direction Y and penetrate the first interlayer insulating layer ILD1. Both end portions of each of the mold structures MS, which are in contact with the first interlayer insulating layer ILD1, may have stair structures STS_a. The both end portions of each of the mold structures MS may be opposite to each other in the second direction Y.

Each of the first stack structure blocks STB1 may include first stack structures ST1 and ST1a spaced apart from each other in the first direction X, and each of the second stack structure blocks STB2 may include second stack structures ST2 and ST2a spaced apart from each other in the first direction X. In some embodiments, sidewalls of the first and second stack structure blocks STB1 and STB2, which are in contact with the separation structure SRS, may be flat surfaces substantially perpendicular to the top surface of the substrate 100.

Sidewalls SS2 of the first and second stack structures ST1a and ST2a closest to the separation structure SRS may be flat surfaces substantially perpendicular to the top surface of the substrate 100. The sidewalls SS2 of the first and second stack structures ST1a and ST2a may be parallel to the second direction Y and may be in contact with first and second contact structures 400a and 400b disposed between the separation structure SRS and the first stack structure ST1a and between the separation structure SRS and the second stack structure ST2a, respectively.

In some embodiments, both end portions of each of the first and second stack structures ST1, ST1a, ST2 and ST2a, which are in contact with the first interlayer insulating layer IDL1, may have stair structures STS. The both end portions of each of the first and second stack structures ST1, ST1a, ST2 and ST2a may be opposite to each other in the second direction Y. In some embodiments, a width W1 of the mold structure MS in the first direction X may be substantially equal to a width W2, in the first direction X, of each of the first and second stack structures ST1, ST1a, ST2 and ST2a (W1=W2). In certain embodiments, the width W1 of the mold structure MS in the first direction X may be different from the width W2, in the first direction X, of each of the first and second stack structures ST1, ST a, ST2 and ST2a (W1≠W2).

First contact plugs 610a may be arranged along a circumference of each of the blocks BLK when viewed in a plan view. The first contact plugs 610a may penetrate the first interlayer insulating layer ILD1. Second and third contact plugs 610b and 610c may be disposed in each of the mold structures MS. The second and third contact plugs 610b and 610c may penetrate the mold structures MS. The second contact plugs 610b may be arranged along the first separation layer SL1 in each of the mold structures MS, and the third contact plugs 610c may be arranged along the second separation layer SL2 in each of the mold structures MS. The second contact plugs 610b and the third contact plugs 610c may be spaced apart from each other.

Figure 20:
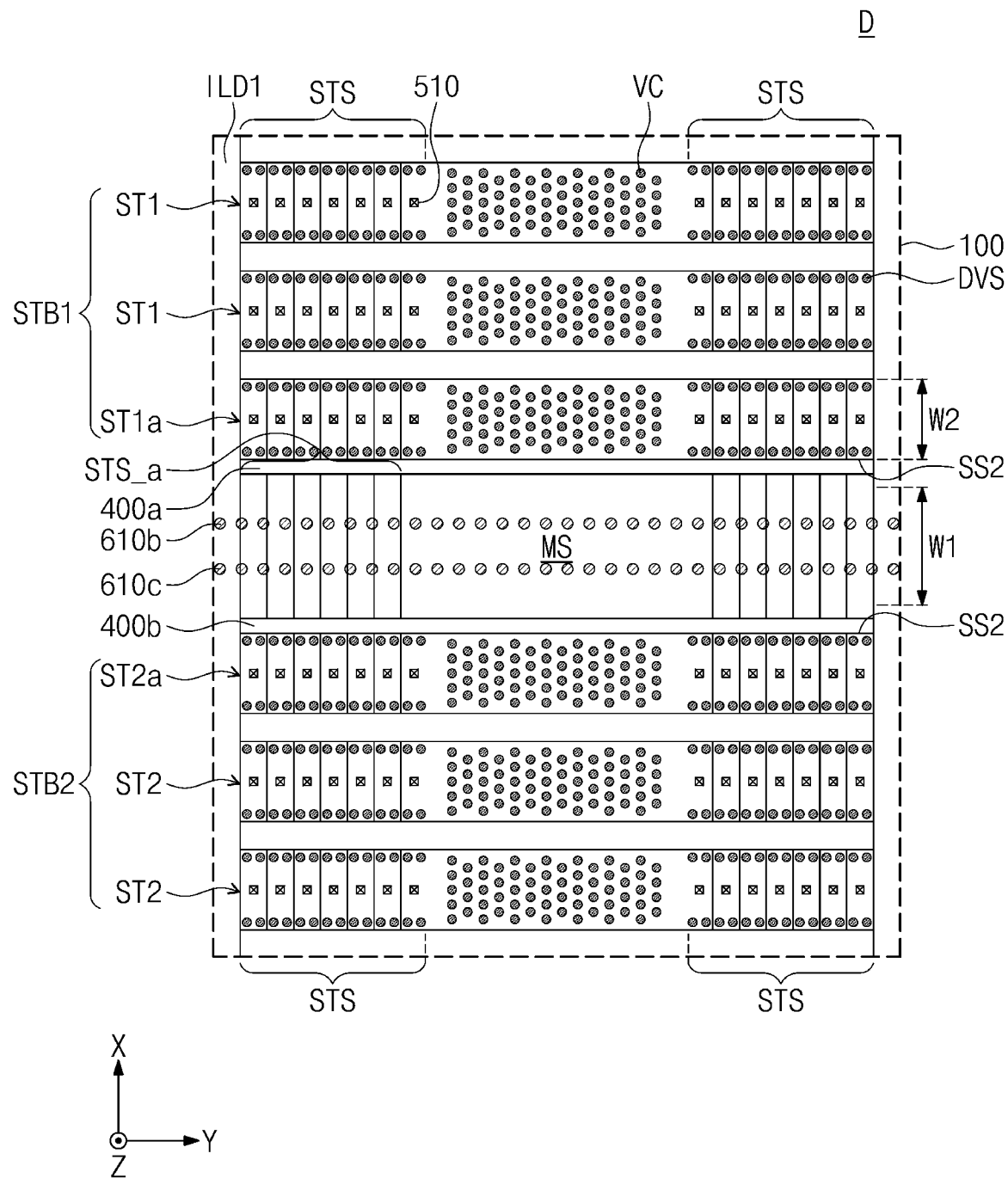
FIG. 20 is an enlarged view of the portion 'D' of FIG. 18.

FIG. 20 is an enlarged view of the portion 'D' of FIG. 18. Hereinafter, the same elements or components as described in the above embodiments of FIGS. 18 and 19 will be indicated by the same reference numerals or the same reference designators, and the descriptions thereto may be omitted for the purpose of ease and convenience in explanation.

Referring to FIG. 20, the first contact structure 400a between the first stack structure ST1a and the separation structure SRS may be in contact with the mold structure MS of the separation structure SRS, and the second contact structure 400b between the second stack structure ST2a and the separation structure SRS may be in contact with the mold structure MS of the separation structure SRS. In other words, the first and second separation layers SL1 and SL2 may be omitted in the separation structure SRS in the present embodiment.

The second contact plugs 610b may be arranged in the mold structure MS in the second direction Y along the first contact structure 400a being in contact with the mold structure MS, and the third contact plugs 610c may be arranged in the mold structure MS in the second direction Y along the second contact structure 400b being in contact with the mold structure MS.

In some embodiments, a width W1 of the mold structure MS in the first direction X may be greater than the width W2, in the first direction X, of each of the first and second stack structures ST1, ST1a, ST2 and ST2a (W1>W2). Other structure of the embodiment of FIGS. 18 to 20 may be the same as that described with respect to FIGS. 1 to 7 and/or the same as any one of the alternative embodiments of FIGS. 1 to 7.

According to the embodiments of the inventive concepts, the first to fifth contact plugs may be arranged to surround the stack structure blocks, respectively, and thus the resistance of electrical connection to the substrate may be reduced. As a result, the operating performance of the 3D semiconductor memory device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:
1. A three-dimensional (3D) semiconductor memory device comprising:
a first stack structure block comprising first stack structures arranged side by side in a first direction on a substrate;

a second stack structure block comprising second stack structures arranged side by side in the first direction on the substrate;

a separation structure disposed on the substrate comprising a mold layer stack of first mold layers and second mold layers that are interleaved with one another, the mold layer stack being positioned between a first end portion of the first stack structure block and a first end portion of the second stack structure block; and a contact plug penetrating the separation structure, wherein a bottom surface of the contact plug is in contact with the substrate, wherein the first end portion is flat and extends vertically from the bottom of the first stack structure block to the top of the first stack structure block, wherein the first end portion of the second stack structure block is flat and extends vertically from the bottom of the second stack structure block to the top of the second stack structure block, wherein the first stack structure block has a second end portion that is at an opposite side of the first stack structure block from the first end portion of the first stack structure block, wherein the second stack structure block has a second end portion that is at an opposite side of the second stack structure block from the first end portion of the second stack structure block, and wherein the second end portions of the first and second stack structure blocks have stair structures.

2. The 3D semiconductor memory device of claim 1, wherein the bottom surface of the contact plug is disposed below the top surface of the substrate.

3. The 3D semiconductor memory device of claim 1, further comprising a plurality of contact plugs penetrating the separation structure and being in contact with the substrate, the plurality of contact plugs including the contact plug, wherein the plurality of contact plugs includes first contact plugs and second contact plugs, wherein the first contact plugs are arranged along a first sidewall of the first stack structure block, which is in contact with the separation structure, and wherein the second contact plugs are arranged along a first sidewall of the second stack structure block, which is in contact with the separation structure.

4. The 3D semiconductor memory device of claim 1, wherein the separation structure further comprises:

a first separation layer between the first stack structure block and the first and second mold layers;

a second separation layer between the second stack structure block and the first and second mold layers; and a plurality of contact plugs penetrating the separation structure and being in contact with the substrate, the plurality of contact plugs including the contact plug, wherein the plurality of contact plugs includes first contact plugs and second contact plugs, wherein the first contact plugs are arranged along the first separation layer, and wherein the second contact plugs are arranged along the second separation layer.

5. The 3D semiconductor memory device of claim 4, wherein the first and second separation layers are formed of the same material as the first mold layers or the second mold layers.

6. The 3D semiconductor memory device of claim 1, wherein each of the first stack structures comprises gate electrodes and insulating patterns that are interleaved with one another, wherein each of the first mold layers are disposed at the same level as a corresponding insulating pattern, and wherein each of the second mold layers are disposed at the same level as a corresponding gate electrode.

7. The 3D semiconductor memory device of claim 1, wherein the first end portion of the first stack structure block is in contact with the separation structure, and wherein the first end portion of the second stack structure block is in contact with the separation structure.

8. The 3D semiconductor memory device of claim 1, wherein the 3D semiconductor memory device further comprises an interlayer insulating layer, and wherein the interlayer insulating layer is in contact with the second end portion of the first stack structure block and the second end portion of the second stack structure block.

9. The 3D semiconductor memory device of claim 1, wherein each of the first stack structures comprises gate electrodes, the 3D semiconductor memory device comprises:

cell contact plugs being in contact with end portions of the gate electrodes, wherein the contact plug is formed of the same material as the cell contact plugs.

10. The 3D semiconductor memory device of claim 1, further comprising:

a lower substrate disposed under the substrate;

a peripheral circuit structure disposed at the lower substrate, the peripheral circuit structure comprising a transistor, an interconnection conductor, and a via; and a peripheral contact plug penetrating the separation structure and the substrate and electrically connected to the transistor.

11. A three-dimensional (3D) semiconductor memory device comprising:

a first stack structure block comprising first stack structures arranged side by side in a first direction on a first substrate;

a second stack structure block comprising second stack structures arranged side by side in the first direction on the first substrate;

a separation structure disposed on the first substrate between the first stack structure block and the second stack structure block and comprising first mold layers and second mold layers;

a first contact plug penetrating the separation structure and the first substrate;

a second contact plug penetrating the separation structure and electrically connected to the first substrate; and a connection line electrically connecting the first contact plug and the second contact plug.

12. The 3D semiconductor memory device of claim 11, further comprising:

a second substrate disposed under the first substrate; and a peripheral circuit structure disposed at the second substrate and comprising a transistor, wherein a lower portion of the first contact plug is disposed in the peripheral circuit structure and is electrically connected to the transistor.

13. The 3D semiconductor memory device of claim 11, wherein a bottom surface of the second contact plug is in contact with the first substrate.

14. A three-dimensional (3D) semiconductor memory device comprising:
- a first stack structure block comprising first stack structures arranged side by side in a first direction on a substrate, the first stack structure block including a first end portion that is flat and vertically extends above the substrate and including a second end portion that is opposite to the first end portion in a second direction, the second direction being perpendicular to the first direction;
- a second stack structure block comprising second stack structures arranged side by side in the first direction on the first substrate, the second stack structure block including a first end portion that is flat and vertically extends above the substrate and including a second end portion that is opposite to the first end portion in the second direction;
- a separation structure disposed on the substrate and disposed on a first sidewall of the first end portion of the first stack structure block and between the first end portions of the first and second stack structure blocks; and
- first contact plugs penetrating the separation structure and arranged along the first sidewall of the first end portion,
- wherein end portions of each of the first stick structures at the second end portion of the first stack structure block and of each of the second stack structures at the second end portion of the second stack structure block have a stair structure.

15. The 3D semiconductor memory device of claim 14,
- wherein the first stack structure block further includes a third end portion that is flat and vertically extends above the substrate,
- wherein the first sidewall of the first end portion is parallel to the first direction when viewed in a plan view, and
- wherein a sidewall of the third end portion is parallel to the second direction.

16. The 3D semiconductor memory device of claim 14, wherein the separation structure comprises:
- a mold structure disposed on the substrate and disposed on the first sidewall of the first end portion of the first stack structure block; and
- a separation layer disposed between the mold structure and the first stack structure block,
- wherein the mold structure comprises:
- a mold layer stack of first mold layers and second mold layers that are interleaved with one another.

17. The 3D semiconductor memory device of claim 14, further comprising:
- transistors disposed under the substrate;
- second contact plugs penetrating the separation structure and the substrate and electrically connected to the transistors; and
- connection lines each electrically connecting a corresponding one of the first contact plugs and a corresponding one of the second contact plugs.

18. The 3D semiconductor memory device of claim 14,
- wherein the first stack structure block further includes: a second end portion opposite to the first end portion in a second direction different from the first direction; and a third end portion and a fourth end portion which are disposed between the first end portion and the second end portion and are opposite to each other in the first direction,
- the 3D semiconductor memory device further comprising:
- an interlayer insulating layer surrounding a second sidewall of the second end portion, a third sidewall of the third end portion, and a fourth sidewall of the fourth end portion; and
- second contact plugs penetrating the interlayer insulating layer,
- wherein the second contact plugs are arranged along the second sidewall of the second end portion, the third sidewall of the third end portion, and the fourth sidewall of the fourth end portion.

19. The 3D semiconductor memory device of claim 14,
- wherein the first stack structure block further includes: a second end portion opposite to the first end portion in a second direction intersecting the first direction; and a third end portion and a fourth end portion which are disposed between the first end portion and the second end portion and are opposite to each other in the first direction,
- wherein the separation structure extends onto a third sidewall of the third end portion,
- the 3D semiconductor memory device further comprising:
- an interlayer insulating layer surrounding a second sidewall of the second end portion and a fourth sidewall of the fourth end portion; and
- second contact plugs penetrating the interlayer insulating layer,
- wherein the first contact plugs are arranged along the first sidewall of the first end portion and the third sidewall of the third end portion, and
- wherein the second contact plugs are arranged along the second sidewall of the second end portion and the fourth sidewall of the fourth end portion.

* * * * *